US 6,630,866 B2

(12) United States Patent
Gibson et al.

(10) Patent No.: US 6,630,866 B2
(45) Date of Patent: Oct. 7, 2003

(54) HIGH BETA OUTPUT STAGE FOR HIGH SPEED OPERATIONAL AMPLIFIER

(75) Inventors: Neil Gibson, Freising (DE); Marco Corsi, Parker, TX (US); Tobin Hagan, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/005,463

(22) Filed: Dec. 3, 2001

(65) Prior Publication Data

US 2003/0102921 A1 Jun. 5, 2003

(51) Int. Cl.[7] ................................................. H03F 3/26
(52) U.S. Cl. ..................... 330/267; 330/263; 330/264; 330/265; 330/288; 330/270; 330/271
(58) Field of Search ................................ 330/265, 267, 330/263, 264, 288, 255, 296, 51, 270, 271

(56) References Cited

U.S. PATENT DOCUMENTS

| | | | | |
|---|---|---|---|---|
| 5,789,982 A | * | 8/1998 | Uscategui et al. .......... 330/255 |
| 5,977,829 A | * | 11/1999 | Wells .......................... 330/270 |
| 6,028,481 A | * | 2/2000 | Gerstenhaber et al. ...... 330/263 |
| 6,154,092 A | * | 11/2000 | Lee et al. ...................... 330/51 |
| 6,166,603 A | * | 12/2000 | Smith .......................... 330/263 |
| 6,249,187 B1 | * | 6/2001 | Chou et al. .................. 330/288 |
| 6,262,633 B1 | * | 7/2001 | Close .......................... 330/267 |
| 6,384,684 B1 | * | 5/2002 | Redman-White ........... 330/263 |

* cited by examiner

Primary Examiner—Michael Tokar
Assistant Examiner—Linh Van Nguyen
(74) Attorney, Agent, or Firm—W. Daniel Swayze, Jr.; W. James Brady; Frederick J. Telecky, Jr.

(57) ABSTRACT

The present invention provides an high beta, high speed operational amplifier output stage (100). The advantages of the operational amplifier output stage over conventional methods disclosed is up to $\beta_2$ rather than a single beta. The present invention achieves this using an pre-driver sub-stage (122) having a plurality of translinear loops so that there is no net signal loss to the final sub-stage (123). The output of the disclosed operational amplifier output stage takes the form:

$$\delta I_o \approx \beta_n * \beta_p * \delta I_{in}.$$

When used with a localized feedback circuitry, speed performance is increased and bandwidth is extended.

5 Claims, 18 Drawing Sheets

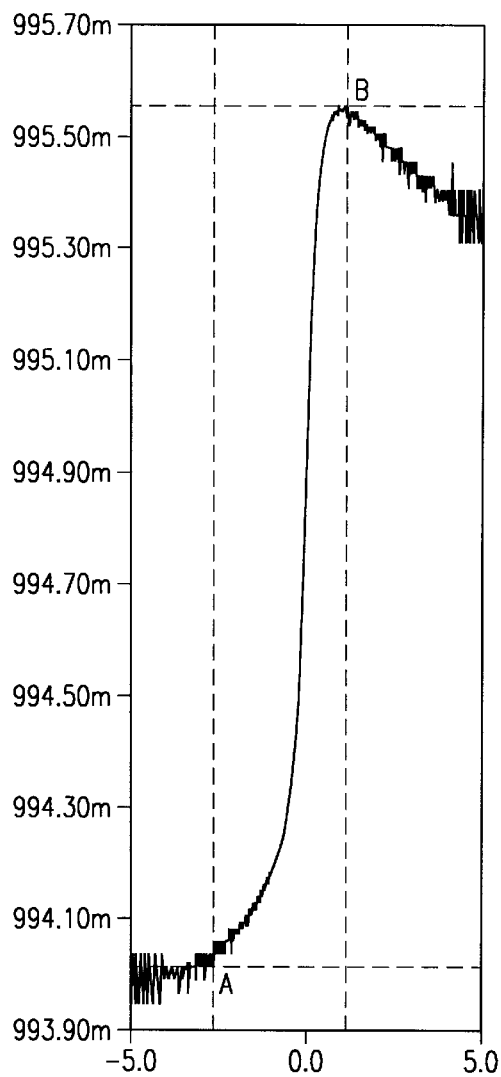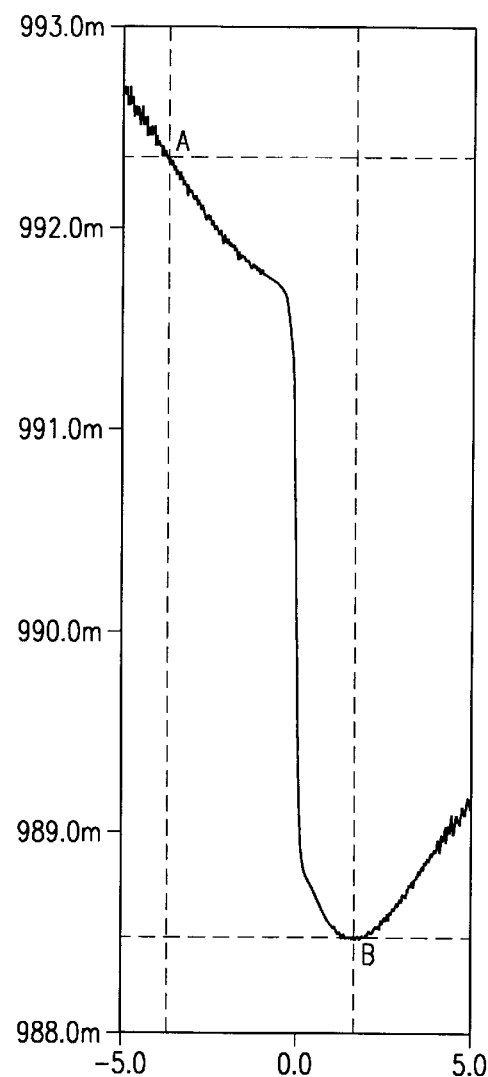
FIG. 3
(PRIOR ART)
FIG. 4
(PRIOR ART)

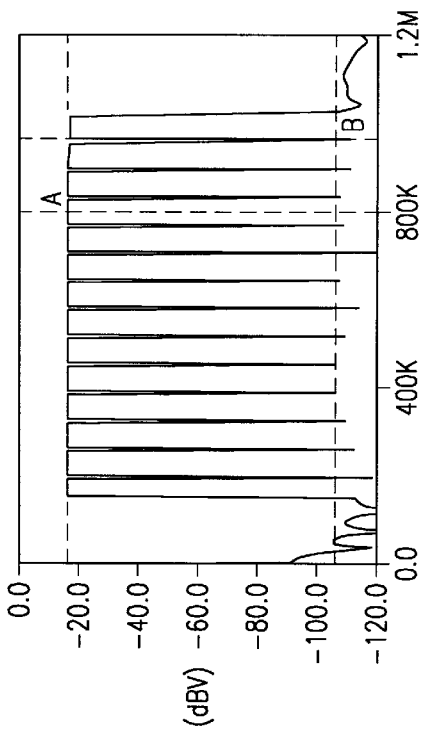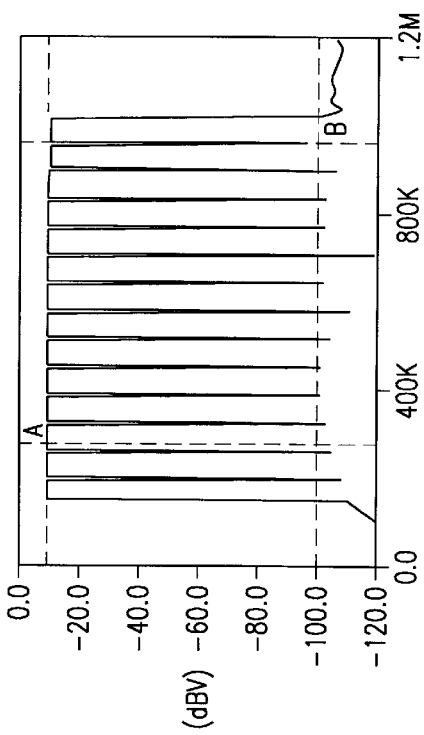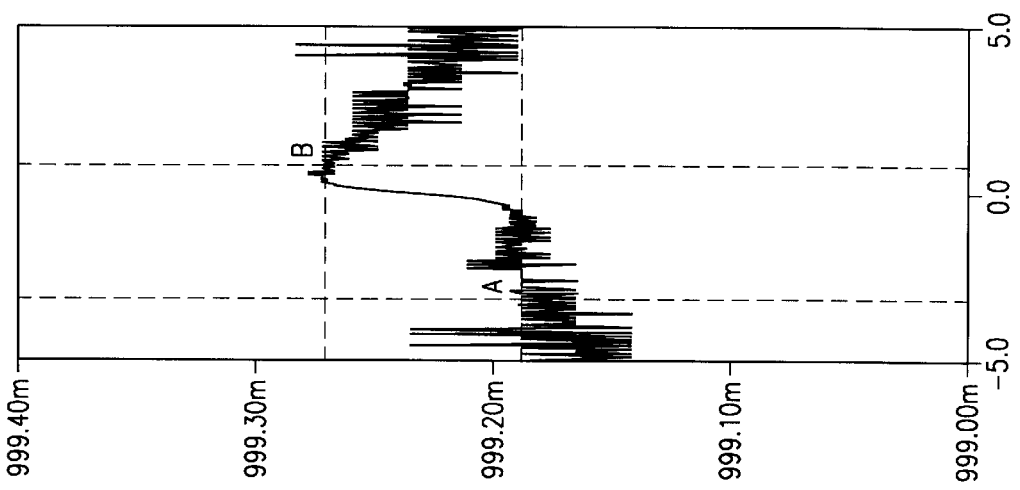

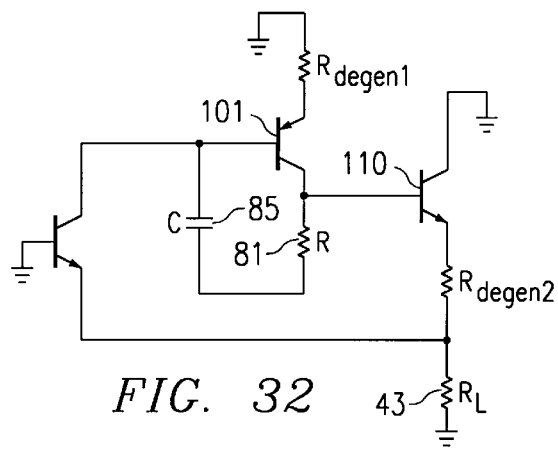
FIG. 32
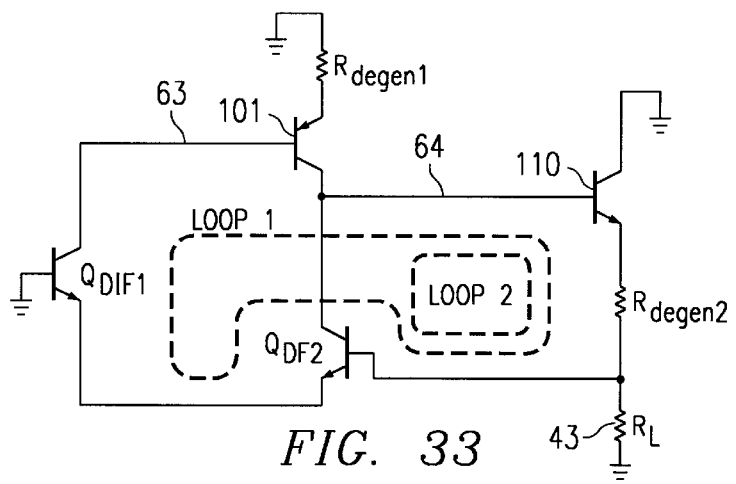
FIG. 33
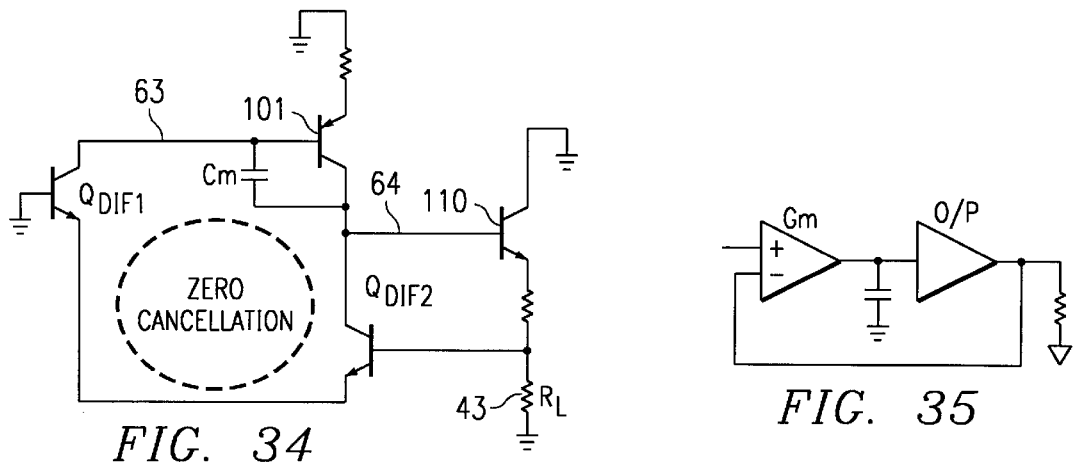
FIG. 34
FIG. 35

HIGH BETA OUTPUT STAGE FOR HIGH SPEED OPERATIONAL AMPLIFIER

TECHNICAL FIELD OF THE INVENTION

This invention generally relates to electronic systems and in particular to operational amplifier output stages.

BACKGROUND OF THE INVENTION

Operational amplifiers are used in many electronic circuits to condition, manipulate and amplify signals. The operating characteristics of a particular operational amplifier are dependent upon its circuit topology. Generally, the operational amplifier consists of a number of stages, each containing internal sub-stages.

Two important operating characteristics of an operational amplifier are its amplification characteristics and its speed. High beta ($\beta$) and high speed are desirable in operational amplifiers that have a variety of application, including DSL Drivers. Beta ($\beta$) refers to the ratio of DC collector current to DC base current in a bipolar junction transistor or current gain from base to collector. $\beta$ is very important parameter that varies with collector current and temperature.

SUMMARY OF THE INVENTION

The present invention achieves technical advantages as a high $\beta$, high speed operational amplifier output stage using a localized feedback system in which current gains are close to $\beta_n * \beta_p$, where $\beta_n$ refers to the beta of either the pre-driver npn transistor, output driver npn transistor or an average of both, depending on the current signal and $\beta_p$ refers to the beta of either the pre-driver pnp transistor, output pnp transistor or an average of both. Where signal current is large and positive, load conduction is through the output npn transistor and pre-driver pnp transistor. Where signal current is large and negative, load conduction is through the pre-driver npn transistor and output pnp transistor. Where the signal is small, load conduction varies in tandem through the output npn transistor and pre-driver pnp transistor and the output pnp transistor and pre-driver npn transistor.

The output stage can be seen to comprise a pre-driver sub-stage and final sub-stage. The pre-driver sub-stage is further comprised of a first and a second pre-driver sub-stage circuit. In addition, the final sub-stage is further comprised of a first and a second final sub-stage circuit. The input to the present invention comprises a transconductance ("$g_m$") cell which, when a voltage is applied thereto, an error voltage appears across the input $g_m$ cell and an error current is produced at the output of the input $g_m$ cell. The error current ($\delta I_{in}$) flows into the emitters of two pre-driver sub-stage transistors and flows out of their collectors into the bases of two other pre-driver transistors. Through this translinear loop, no net signal is lost. The gained up error currents then flow into the final sub-stage translinear loop, specifically, into the bases of two final sub-stage transistors. Effectively, in the small signal context, the first pre-driver sub-stage circuit amplifies a positive portion of the current signal for output to the first final sub-stage circuit while the second pre-driver sub-stage circuit amplifies a negative portion of the current signal for output to the second final sub-stage circuit. The first and second final sub-stages further amplify the positive portion and negative portion, respectively, of the current signal.

The first and second final sub-stage circuits are interconnected at an output terminal of the operational amplifier final stage such that the amplified positive portion of the signal and amplified negative portion of the signal are joined substantially in phase, in the form $\delta I_o \approx B_n * B_p * \delta I_{in}$. By feeding back a portion of the output signal using a variety of feedback principles, speed characteristics can be further improved.

BRIEF DESCRIPTION OF THE DRAWINGS

For a more complete understanding of the present invention, reference is made to the detailed description taken in conjunction with the following drawings:

FIG. 3 is a graph illustrating the linearity characteristics of the first conventional operational amplifier. This figure shows the first derivative ($\delta V_o/\delta V_i$) of the amplifier's DC transfer characteristic;

FIG. 4 is a graph illustrating the linearity characteristics of the second conventional operational amplifier. This figure shows the first derivative ($\delta V_o/\delta V_i$) of the amplifier's DC transfer characteristic;

FIG. 9 is a graph illustrating the linearity characteristics of the first embodiment of the present invention. This figure shows the first derivative ($\delta V_o/\delta V_i$) of the amplifier's DC transfer characteristic;

FIGS. 10A and 10B are graph illustrating the linearity characteristics of the first embodiment of the present invention using a DMT signal with missing tones;

FIG. 32 is a circuit diagram implementing conventional Miller compensation using a current feedback with the embodiments of the present invention;

FIG. 33 is a circuit diagram illustrating a voltage feedback stability loop;

FIG. 34 is a circuit diagram illustrating implementation of conventional Miller compensation using voltage feedback to achieve right-half-plane zero ("RHPZ") cancellation with the embodiments of the present invention; and FIG. 35 is a circuit diagram illustrating a method for achieving low frequency precision in either of the first or second embodiments of the present invention.

DESCRIPTION OF CONVENTIONAL AMPLIFIER OUTPUT STAGES

Figure 2:
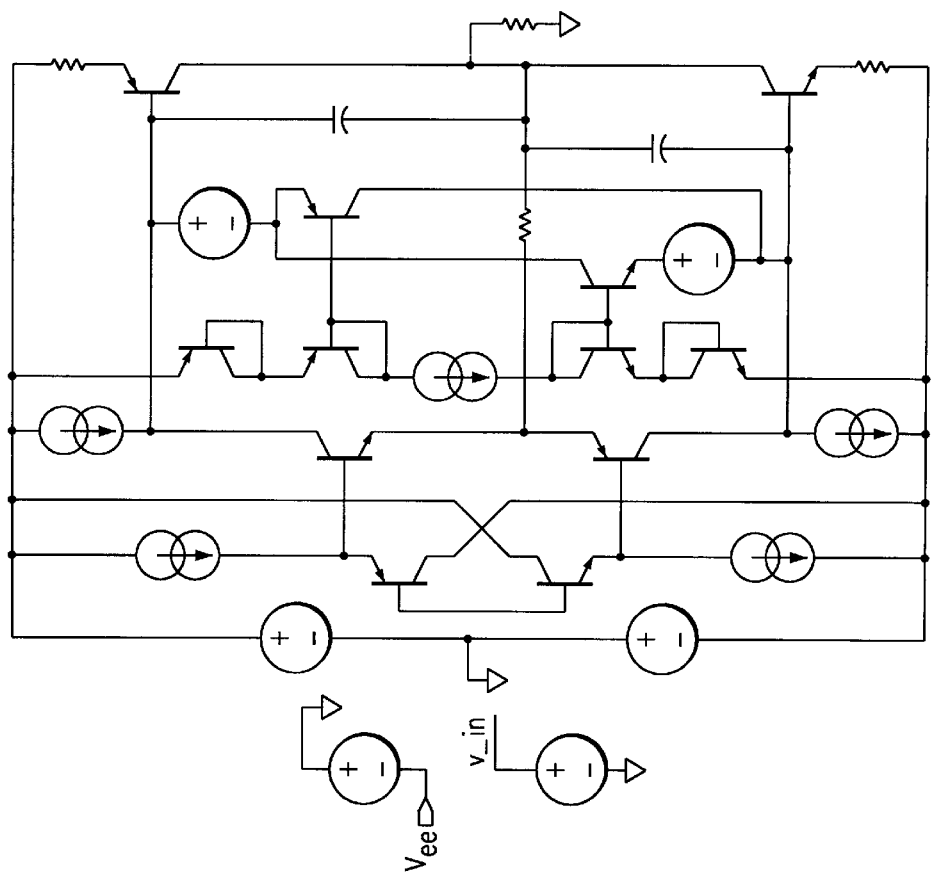
FIG. 2 is a circuit diagram of a second conventional operational amplifier output stage.
Figure 1:
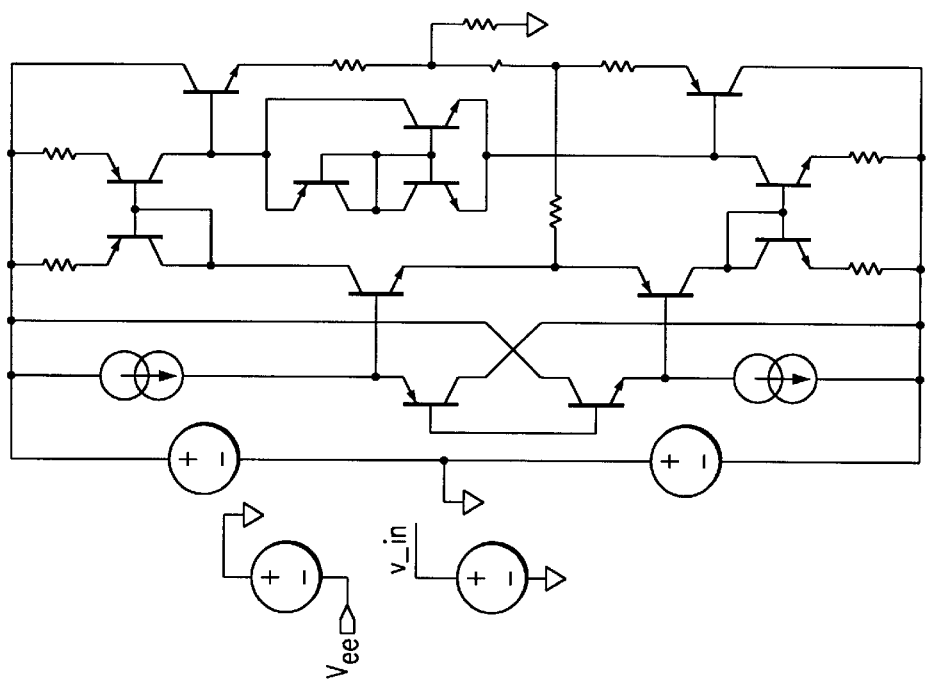
FIG. 1 is a circuit diagram of a first conventional operational amplifier output stage.
Figure 6:
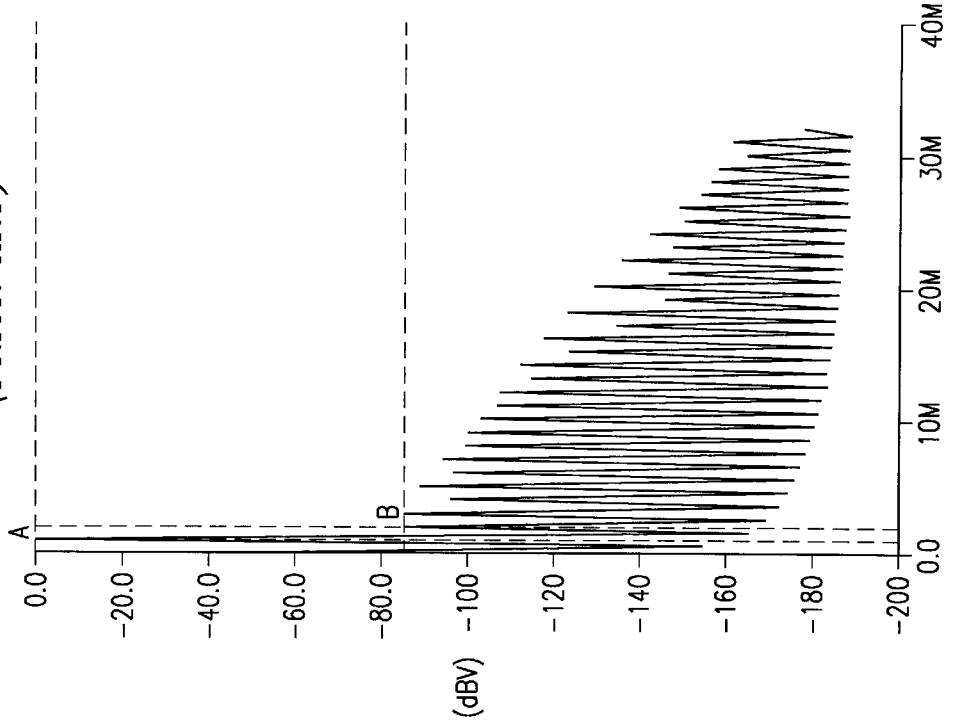
FIG. 6 is a graph illustrating the typical linearity characteristics of the first conventional operational amplifier output stage in harmonic distortion form.
Figure 5A:
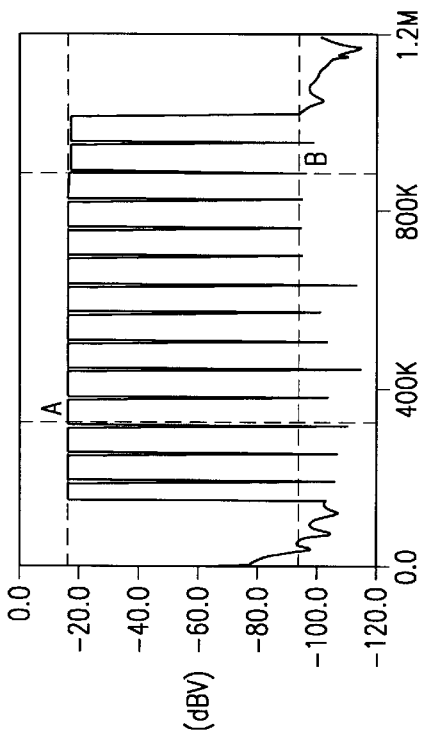
FIGS. 5A and 5B show the single ended and differential linearity characteristics of the first conventional operational amplifier output stage using a discrete multi-tone ("DMT") signal with missing tones.
Figure 5B:
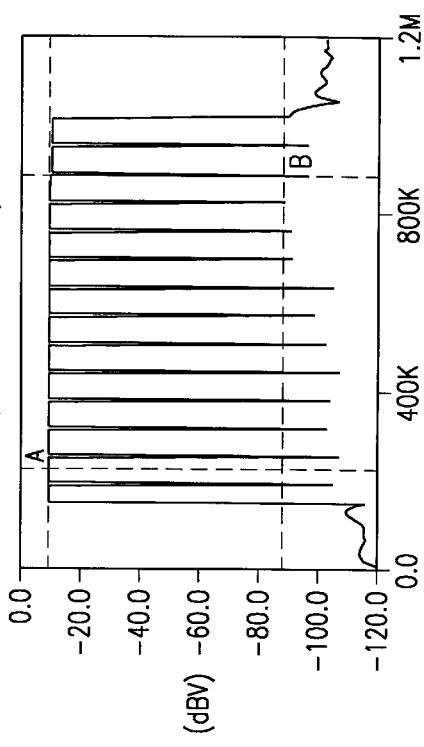

FIG. 1 is a circuit diagram of a first conventional operational amplifier output stage. FIG. 2 is a circuit diagram of a second conventional operational amplifier output stage. FIG. 3 illustrates the linearity characteristics of such first conventional operational amplifier by showing the first derivative of the DC transfer characteristic. FIG. 4 illustrates the linearity of such second conventional operational amplifier by showing the first derivative off the DC transfer characteristic. FIG. 5 illustrates the single ended and differential linearity of such first conventional operational amplifier with a discrete multi tone ("DMT") signal with missing tones. DMT signal is a broadband signal containing many sinusoids spaced at equal intervals. The missing tone performance looks for intermodulation products from the broadband DMT signal in at a frequency where there is no sinewave present in the DMT signal. DMT is a rigorous test of an amplifier's linearity. FIG. 6 illustrates the typical linearity of such first and second conventional operational amplifiers in harmonic distortion form.

DETAILED DESCRIPTION OF THE PRESENT INVENTION

Figure 7:
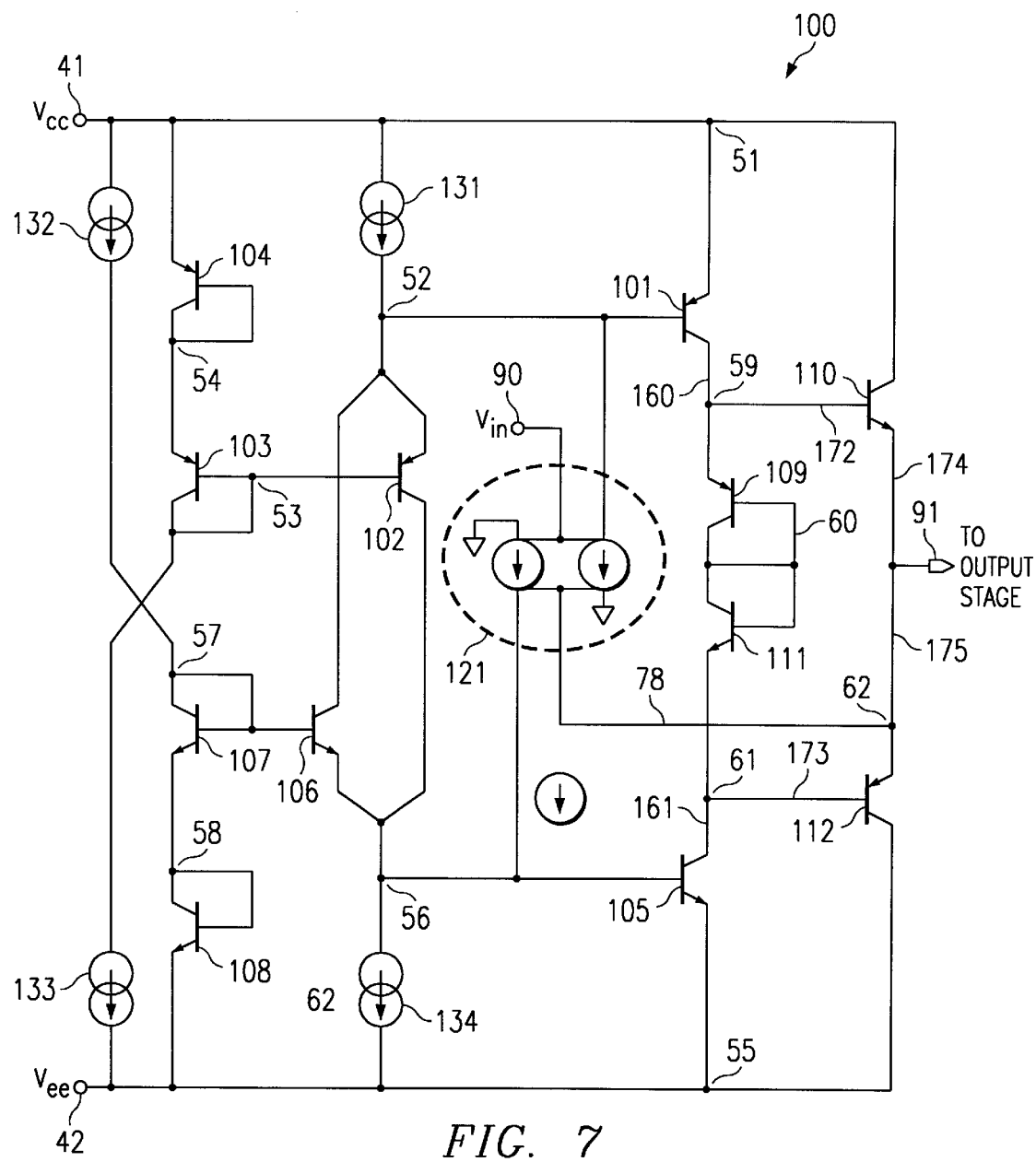
FIG. 7 is a circuit diagram of a first embodiment of the present invention with a $g_m$ cell input.
Figure 8:
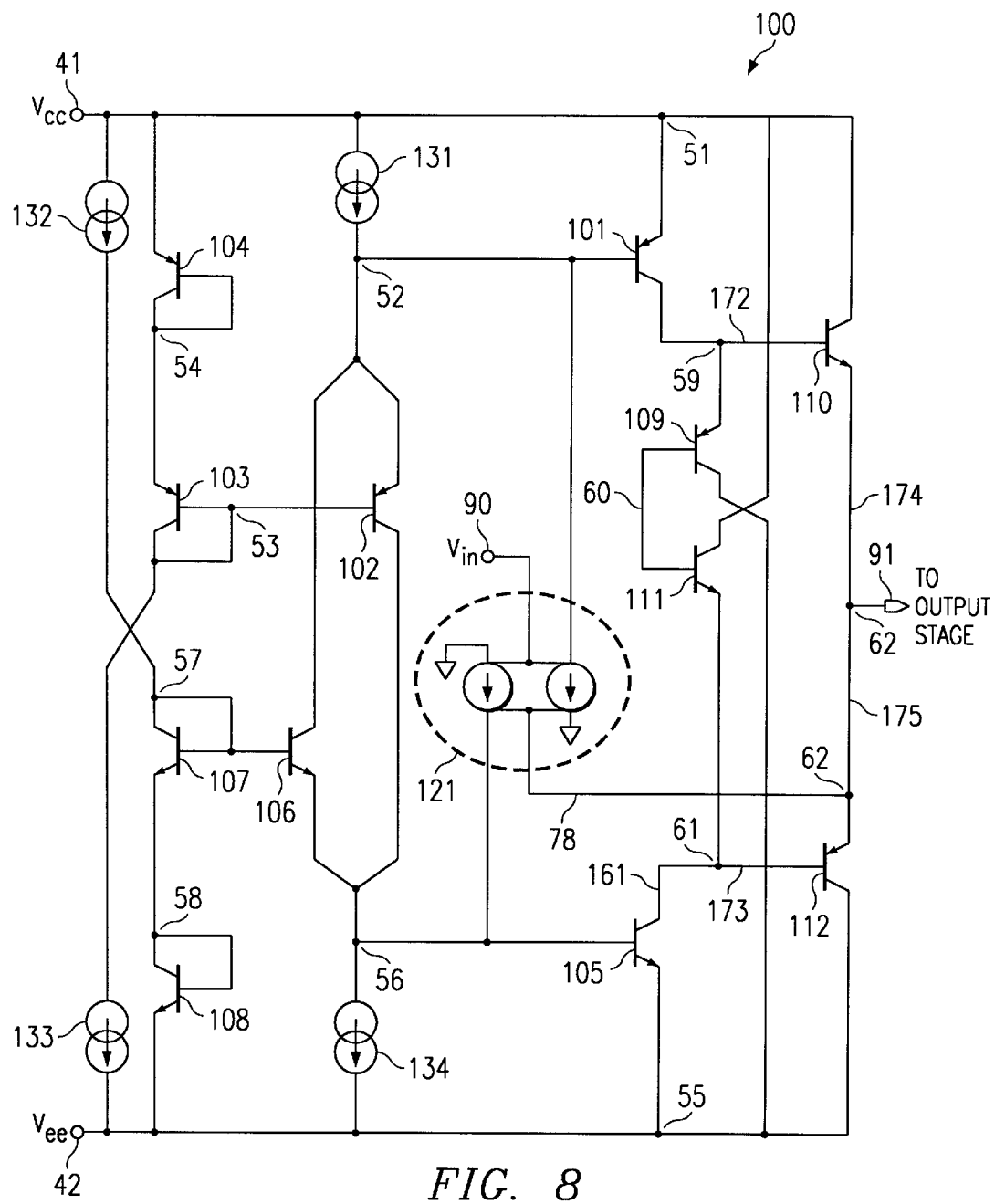
FIG. 8 is a circuit diagram of a second embodiment of the present invention with a $g_m$ cell input.

Two embodiments of the present invention are shown in FIGS. 7 and 8. As compared to the conventional operational amplifier output stages as disclosed in FIGS. 1 and 2, the disclosed embodiments of an operational amplifier output stage as shown in FIGS. 7 and 8, provides a high β output (up to $β^2$) and high speed with significantly reduced crossover distortion. Because of its high speed, the disclosed invention has the advantage of extended bandwidth. The disclosed operational amplifier output stage comprises a pre-driver sub-stage utilizing translinear current loops and a final sub-stage. The final sub-stage of the operational amplifier output stage disclosed herein comprises a complementary set of compound darlington transistors enclosed in a localized feedback system.

As used herein, translinearity refers to the characteristics of non-linear circuits whose operation is based on the exponential current-voltage relationship of the bipolar junction transistor; β refers to the ratio of DC collector current to DC base current in a bipolar junction transistor or current gain from base to collector; a represents the fraction of signal current going into one half of the pre-driver sub-stage, λ refers to the fraction of signal current going into the other half of the pre-driver sub-stage, and A refers to the emitter area of the BJT in consideration.

FIG. 7 is a circuit diagram of the first embodiment of an operational amplifier output stage having reduced supply current and high linearity constructed according to the teachings of the present invention. The circuit 100 includes an input $g_m$ cell 121, pre-driver sub-stage comprised of eight pre-driver sub-stage transistors 101, 102, 103, 104, 105, 106, 107 and 108, a final sub-stage comprising four final sub-stage transistors 109, 110, 111 and 112, and four current sources 131, 132, 133 and 134. The input $g_m$ cell 121 is configured to accept an input voltage signal, produce an error voltage across: its input, and produce an output error current ($\delta I_{in}$).

As shown therein, a first voltage supply rail 41 is coupled to a first node 51, a second voltage supply rail 42 is coupled to a fifth node 55.

The first pre-driver sub-stage circuit consists of four transistors 101, 102, 103 and 104. In the first pre-driver sub-stage circuit, the emitter of the first transistor 101 is coupled to the first voltage supply rail 41 at the first node 51, and the base of the first transistor 101 is coupled to a second node 52. The emitter of the second transistor 102 is also coupled to the second node 52; and its base is coupled to a third node 53. The base and collector of the third transistor 103 are also coupled to the third node 53. The collector arid base of the fourth transistor 104 are each coupled to a fourth node 54. The emitter of the fourth transistor 104 is coupled to the voltage supply rail 41 at the first node 51.

The second pre-driver sub-stage circuit comprises four transistors 105, 106, 107 and 108. The second voltage supply rail 42 is coupled to the fifth node 55. The emitter of the fifth transistor 105 is coupled to the second voltage supply rail 42 at the fifth node 55 and its base is coupled to a the sixth node 56. The emitter of the sixth transistor 106 is coupled, to the sixth node 56 and its base is coupled to a seventh node 57. The collector of the sixth transistor 106 is coupled to the second node 52. The base and collector of the seventh transistor 107 are coupled to a seventh node 57 and its emitter is coupled to an eighth node 58. The collector and base of the eighth transistor 108 are coupled to the eighth node 58, and the emitter of the eighth transistor 108 is coupled to the second voltage supply rail 42 at the fifth node 55.

The collector of the second transistor 102 and the emitter of the sixth transistor 106 are coupled to a common sixth node 56. The emitter of the second transistor 102 and the emitter of the sixth transistor 106 are coupled to a common second node 52. The cross connection advantageously results in no error current being lost in the translinear loops.

A first current source 131 is coupled to the first voltage supply rail 41 at the first node 51 and at the second node 52. A second current source 132 is coupled to the first voltage supply rail 41 at the first node 51 and at the seventh node 57. A third current source 133 is coupled to the second voltage supply rail 42 at the fifth node 55 and at the third node 53. A fourth current source 134 is coupled to the voltage supply rail 42 at the fifth node 55 and at the sixth node 56.

The final sub-stage 123 comprises a complementary pair of darlington transistors. The first set of darlington transistors is comprised of the ninth and tenth transistors 109 and 110. The emitter of the ninth transistor 109 is coupled to the collector of the first transistor 101 at a ninth node 59. The base and collector of the ninth transistor 109 are coupled at a tenth node 60. The base of the tenth transistor 110 is coupled to the ninth node 59, and the collector of the tenth transistor 110 is coupled to the first voltage supply rail 41 at the first node 51.

The second set of darlington transistors is comprised of the eleventh and twelfth transistors 111 and 112. The emitter of the eleventh transistor 111 is coupled to the collector of the fifth transistor 105 at an eleventh node 61. The base and collector of the eleventh transistor 111 are coupled to the base and collector of the ninth transistor 109 at the tenth node 60. The base of the twelfth transistor 112 is coupled to the eleventh node 61, and the collector of the twelfth transistor 112 is coupled to the second voltage supply rail 42 at the fifth node 55. The twelfth node 62 couples the emitter of the tenth transistor 110 to the emitter of the twelfth transistor 112. An output terminal 91 is coupled to the twelfth node 62. The twelfth node 62 also interconnects the output terminal 91 to the $g_m$ cell input 121. The configuration of the ninth transistor 109 and eleventh transistor 111 of the first embodiment of the present invention is also referred to as type I biasing.

A second embodiment of the present invention is disclosed in FIG. 8. The second embodiment is also referred to as type II biasing of the output transistors. In this second embodiment, the collectors of the ninth transistor 109 and the eleventh transistor 111 are not coupled at the tenth node 60. The collector of the ninth transistor 109 is coupled to the second voltage supply rail $V_{ee}$ 42 at the fifth node 55 and the collector of the eleventh transistor 111 is coupled to the first voltage supply rail $V_{cc}$ 41 at the first node 51. In this case the current gain from the collectors of 101 or 105 to the output node 91 is the average of $\beta_n$ and $\beta_p$. This arrangement minimizes crossover distortion in the output signal. As used herein, $\beta_n$ refers to the beta of transistor 110 and $\beta_p$ refers to the beta of transistor 101, where $\alpha=1$ and $\lambda=1$; or $\beta_n$ refers to the beta of transistor 105 and $\beta_p$ refers to the beta of transistor 112, where $\alpha=0$ and $\lambda=0$, or, in the small signal context, where $\alpha=0.5$ and $\lambda=0.5$, $\beta_n$ refers to the average of the beta of transistor 110 and transistor 105 and $\beta_p$ refers to the beta of the average of transistor 101 and transistor 112, the relative contribution of each such pnp transistor and npn transistor to $\beta_n$ and $\beta_p$ varying proportionally with the variation in $\alpha$ and $\beta$.

Figure 11:
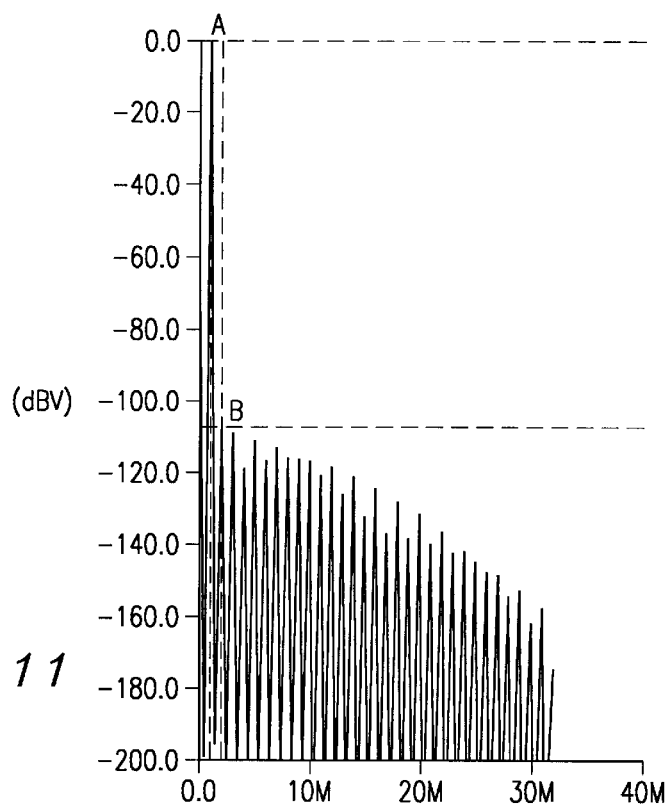
FIG. 11 is a graph illustrating the linearity characteristics of the first embodiment of the present invention in harmonic distortion form.

FIGS. 9, 10 and 11 illustrate different performance aspects of the present invention. Specifically, FIG. 9 shows the linearity characteristics of the first embodiment of the present invention, specifically the first derivative ($\delta V_o/\delta V_i$) of the amplifier's DC transfer characteristic. FIG. 10 shows the linearity characteristics of the first embodiment of the present invention using a DMT signal with missing tones. FIG. 11 shows the linearity characteristics of the first embodiment of the present invention in harmonic distortion form.

Figure 12:
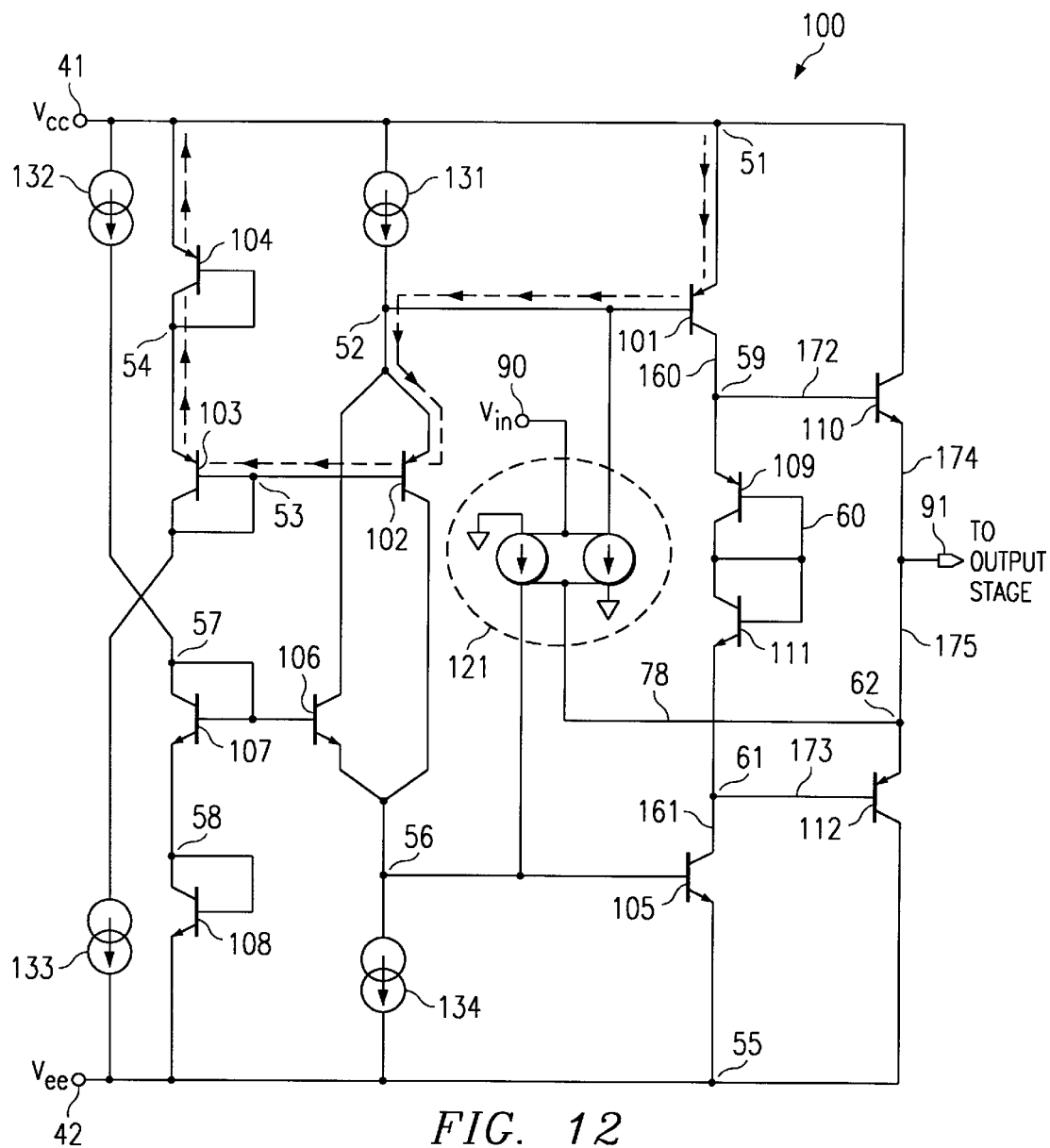
FIG. 12 illustrates the translinear loop formed by the first, second, third and fourth transistors.
Figure 13:
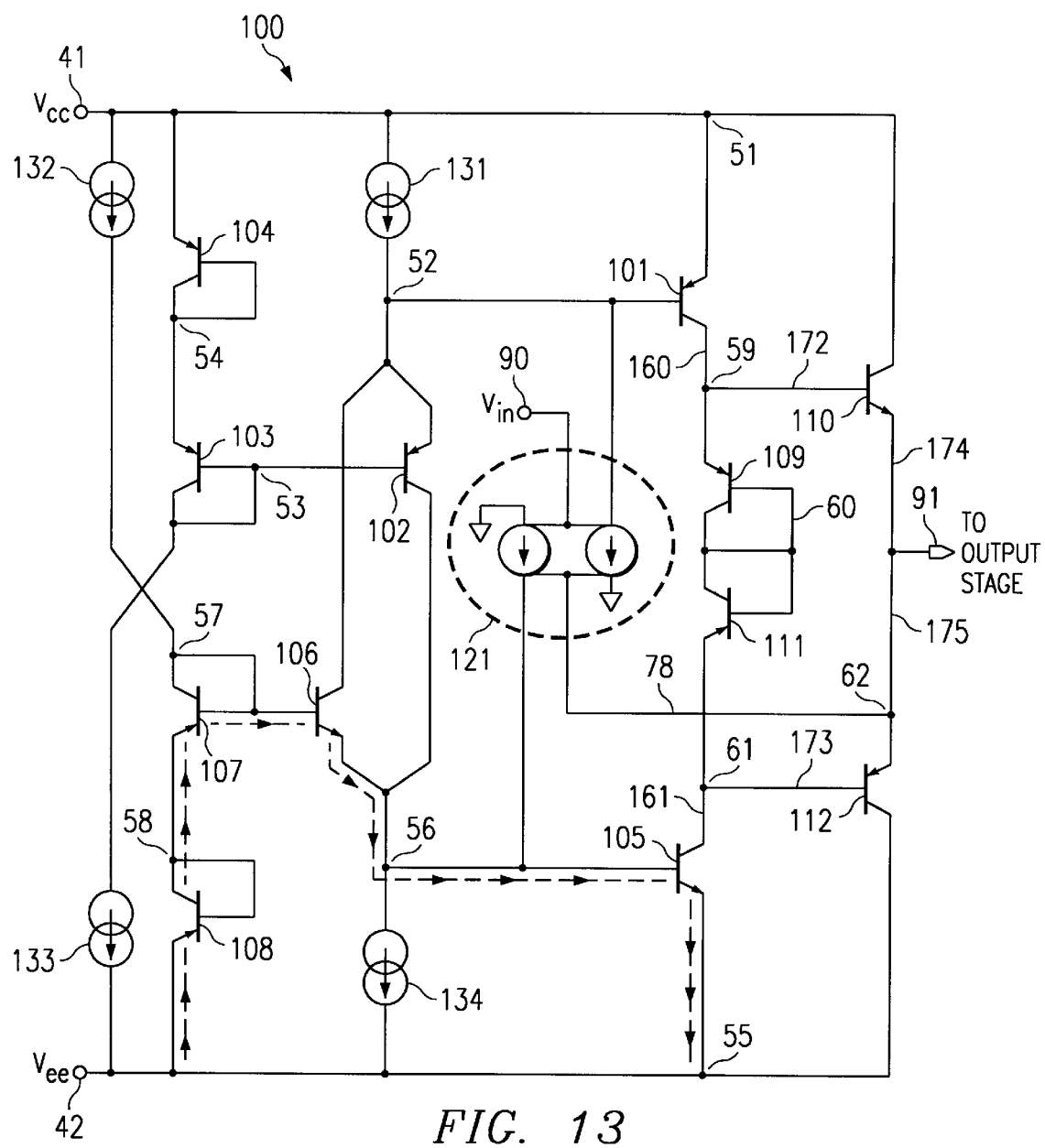
FIG. 13 illustrates the translinear loop formed by the fifth, sixth, seventh and eight transistors.

As shown in FIG. 12, in the first embodiment of the present invention a translinear loop is formed by the third transistor 103, fourth transistor 104, second transistor 102 and first transistor 101. In operation, two sets of current flow into this first translinear loop which sets up a quiescent current through a branch 170 connected at the collector of the first transistor 101. In addition, as shown in FIG. 13, a translinear loop is formed by the seventh transistor 107, the eighth transistor 108, the sixth transistor 106 and the fifth transistor 105. Two sets of current flow in this second translinear loop which sets up a quiescent current through a branch 171 connected at a collector of the fifth transistor 105. These two quiescent currents establish the bias currents for the respective tenth transistor 110 and for the twelfth transistor 112 by means of translinear principles in the loop formed by the ninth transistor 109, eleventh transistor 111, tenth transistor 110 and twelfth transistor 112.

When an input voltage is applied to the input $g_m$ cell 121, an error voltage appears across the output of the input $g_m$ cell 121 and an error current is produced. Advantageously, the cross-connection of the collector of the second transistor 102 to the emitter of the sixth transistor 106, and the collector of the sixth transistor 106 to the emitter of the second transistor 102 ensures that whatever proportion of the error current flowing into the emitters of the second transistor 102 and sixth transistor 106 also flows back out through the collectors of the second transistor 102 and the sixth transistor 106 into the bases of the first transistor 101 and the fifth transistor 105. Advantageously, there is no net signal loss in the pre-driver sub-stage translinear loops.

The error currents into the bases of the first transistor 101 and the fifth transistor 105, are thus gained up by the pre-driver sub-stage contribution of $\beta_p$ and $\beta_n$ These error currents flow into the translinear loop formed by the ninth transistor 109, eleventh transistor 111, tenth transistor 110 and twelfth transistor 112. These amplified error currents can only flow into the bases of the tenth transistor 110 and twelfth transistor 112, where they are amplified by the final sub-stage contribution of $\beta_n$ and $\beta_p$ respectively. Thus, irrespective of whether the error current flows through the top or the bottom route through the circuit it appears at the output terminal 91 amplified by approximately $\beta_n$ multiplied by $\beta_p$, where it develops a correction voltage across the load resistor to move the output to a point of minimum error of the feedback into the input $g_m$ cell 121.

Output Transistor Biasing

Figure 14:
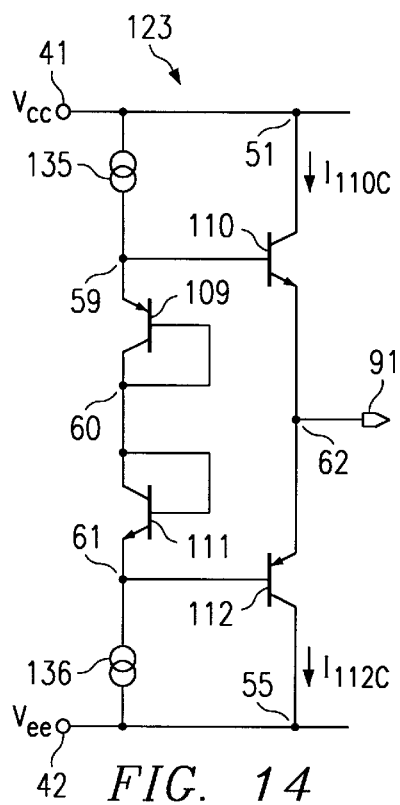
FIG. 14 is a circuit diagram of the final sub-stage of the first embodiment of the present invention using type I biasing of the output transistors in a no-load configuration.

FIG. 14 is a circuit diagram of the final sub-stage 123 of the first embodiment of the operational amplifier output stage in a no load configuration. FIG. 14 illustrates type I biasing of the output transistors as follows: Current is flowing into the collector of the tenth transistor 110, referred to as $I_{Q110C}$, and current is flowing out of the collector of the twelfth transistor 112, referred to as $I_{Q112C}$. The emitter area of the ninth transistor 109 is referred to as $A_{Q109}$ and the emitter area of the eleventh transistor 111 is referred to as $A_{Q111}$. The emitter area of the tenth transistor 110 is referred to as $A_{Q110}$ and the emitter area the twelfth transistor 112 is referred to as $A_{Q112}$. Two current sources $I_{135}$ and $I_{136}$ are shown thereon:

$$I_{135} = I + \frac{\delta I_{sig}}{2} \text{ and } I_{136} = I - \frac{\delta I_{sig}}{2}$$

Therefore:

$$\frac{I_{135}^2}{A_{Q109} * A_{Q111}} = \frac{I_{Q110C} * I_{Q112C}}{A_{Q112} * A_{Q110}}$$

for $\beta_n$ and $\beta_p \gg 1$ and $VA_n$ and $VA_p \gg 1$,
$I_{Q110C} = I_{Q112C} = I_C$.
Therefore, $$\frac{I_{135}^2}{A_{Q109} * A_{Q111}} = \frac{I_C^2}{A_{Q112} * A_{Q110}};$$

and further $$I_C = I_{135} \cdot \sqrt{\frac{A_{Q110} * A_{Q112}}{A_{Q109} * A_{Q111}}}$$

Figure 15:
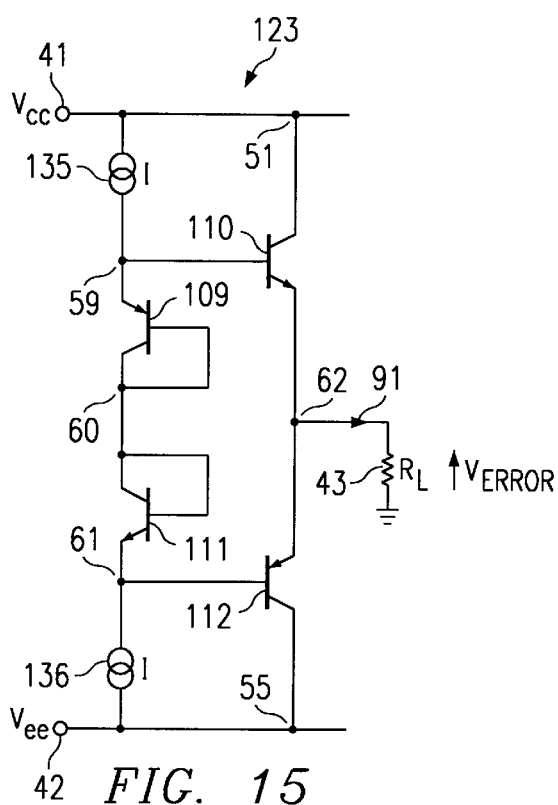
FIG. 15 is a circuit diagram of the final sub-stage of the first embodiment of the present invention using type I biasing of the output transistors with a load.

FIG. 15 is a circuit diagram of the final sub-stage 123 of the first embodiment of the present invention with a load 43. Type I biasing of the output transistors is thus described as follows: When a load 43 is connected to the output terminal 91 and the following do not hold:

$\beta_n$ and $\beta_p \gg 1$, or $VA_n$ and $VA_p \gg 1$, or there is an imbalance between current $I_{Q110C}$ and $I_{Q112C}$.

Since current $I_{Q110C}$ is not equal to $I_{Q112C}$, an error current flows in the load 43 thus developing an offset voltage $V_{error}$ across the load 43.

When the difference in current in the final sub-stage transistors 110 and 112, are taken care of by a localized feedback system, the characteristics of the final sub-stage can be seen as follows: The signal current changes the bias currents by increasing the current through the top circuit and decreasing the current through the bottom circuit. In the limiting case for large current through the top circuit and minuscule current through the bottom circuit, and α is equal to one (1), the translinear loop cuts off the twelfth transistor 112 and all of the signal current flows into the base of the tenth transistor 110 where it appears in the load 43 as follows:

$\beta_n * (\delta I_{sig})$.

Conversely, for large signal current through the bottom circuit and minuscule current at the top circuit, and where a is equal to 0, the translinear loop is again cut off and all of the signal current flows into the base of the twelfth transistor 112 where it appears in the load 43 as follows:

$\beta_p * (\delta I_{sig})$.

For small signal currents, where a is close to half (0.5), the translinear loop is active, that is a quiescent current is flowing through both the tenth transistor 110 and the twelfth transistor 112, the signal current splits with α and (1-α) multiplied by $\delta I_{sig}$ flowing into the base of the twelfth transistor 112. Thus the current gain from input to output is as follows:

$\alpha * \beta_n + (1-\alpha) * \beta_p$, for all cases of a such that α is equal to or greater than zero and equal to or less than 1.

Figure 16:
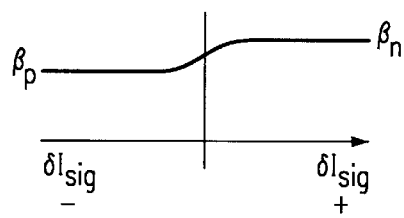
FIG. 16 is a graph illustrating the current gain of the final sub-stage of the first embodiment of the present invention.

As shown in the graph of FIG. 16, the gain will transition from $\beta_p$ to $\beta_n$ through the translinear region.

Figure 17:
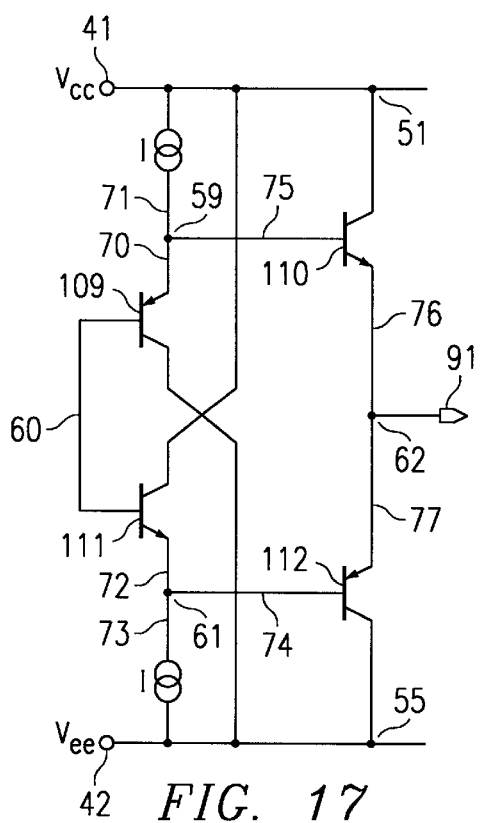
FIG. 17 is a circuit diagram of the final sub-stage of the second embodiment of the present invention using type II biasing of the output transistors in a no load configuration.

FIG. 17 is a circuit diagram of the final sub-stage of the second embodiment of an operational amplifier in a no load configuration. FIG. 17 illustrates type II biasing of the output transistors as follows:

$$\frac{\beta_n * \beta_p * i_b^2}{A_{Q109} * A_{Q111}} = \frac{I_{Q110C} * I_{Q112C}}{A_{Q112} - A_{Q110}}, \text{ and}$$

$$\frac{\beta_n * \beta_p * i_b^2}{A_{Q109} * A_{Q111}} = \frac{(\beta_n * I - \beta_p * \beta_n * i_b)(\beta I - \beta_n * \beta_P * i_b)}{A_{Q112} - A_{Q110}}.$$

The current through branch 70 is: $\beta_p * i_b$.
The current through branch 75 is: $I - \beta_p * i_b$.
The current through branch 72 is: $\beta_n * i_b$.
The current through branch 74 is: $I - \beta_n * i_b$.
The current through branch 76 is: $\beta_n * I - \beta_p * \beta_n * i_b$.
The current through branch 77 is: $\beta_p * I - \beta_n * \beta_p * i_b$.

As can be seen, an offset current $(\beta_n - \beta_p) * I$ will develop an offset voltage in a load, and would self correct in the localized feedback circuit.

Figure 18:
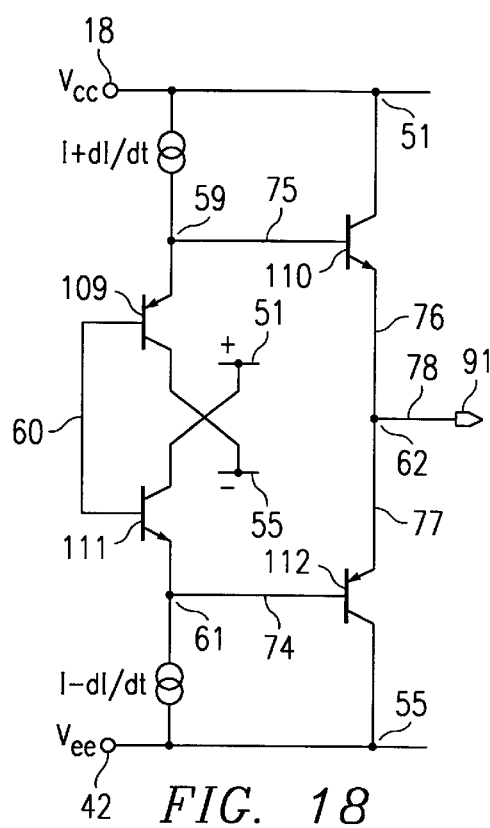
FIG. 18 is a circuit diagram of the final sub-stage of the second embodiment of the present invention using type II biasing of the output transistors with a signal applied to such final sub-stage's input.

Referring to FIG. 18, which illustrates type II biasing of the output transistors:

The current through branch 75 is: $I + \delta I - \beta_p i_b$.
The current through branch 74 is: $I + \delta I - \beta_n i_b$.
The current is through branch 76 is: $(\beta_n * I) + (\beta_n * \delta I) - (\beta_n * \beta_p * i_b)$.
The current through branch 77 is: $(\beta_p * I) - (\beta_p * \delta I) - (\beta_n * \beta_p * \delta I)$.

Thus, the output current through branch 78 is: $i_o = I * (\beta_n - \beta_p) + (\beta_n + \beta_p) * \delta I$.

This result theoretically indicates no crossover distortion in the output, albeit with an offset.

Figure 19:
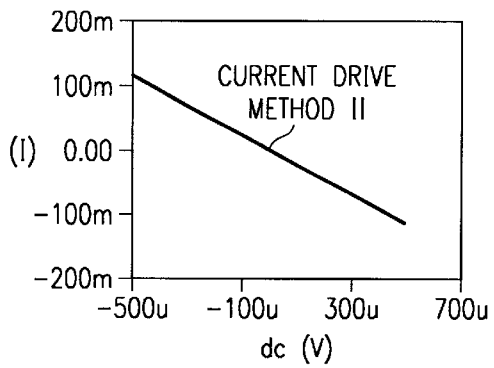
FIG. 19 is a graph illustrating the DC current transfer characteristic of the final sub-stage of FIG. 18.
Figure 20:
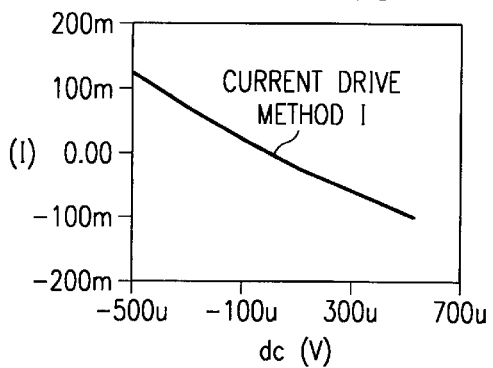
FIG. 20 is a graph illustrating the DC current transfer characteristic of the final sub-stage of FIG. 15.
Figure 21:
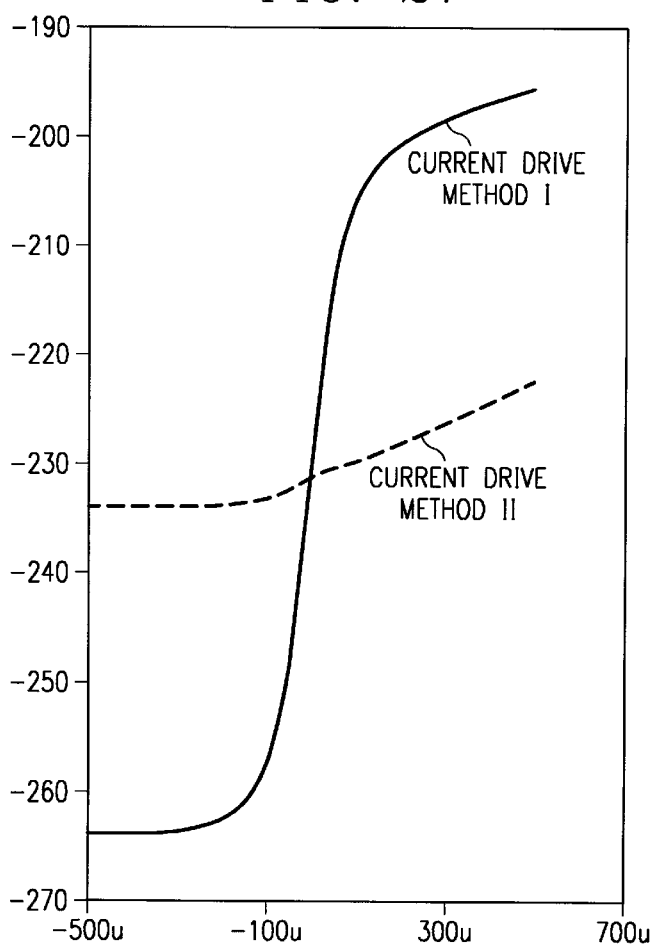
FIG. 21 is a graph illustrating the linearity characteristic of the final sub-stage of FIG. 15 and FIG. 18. This figure shows the first derivative ($\delta I_o/\delta I_i$) of the amplifiers' DC current transfer characteristics.

FIGS. 19, 20 and 21 illustrate the-current drive relationships of the type I and type II biasing schemes.

Pre-Driver Biasing

Figure 22:
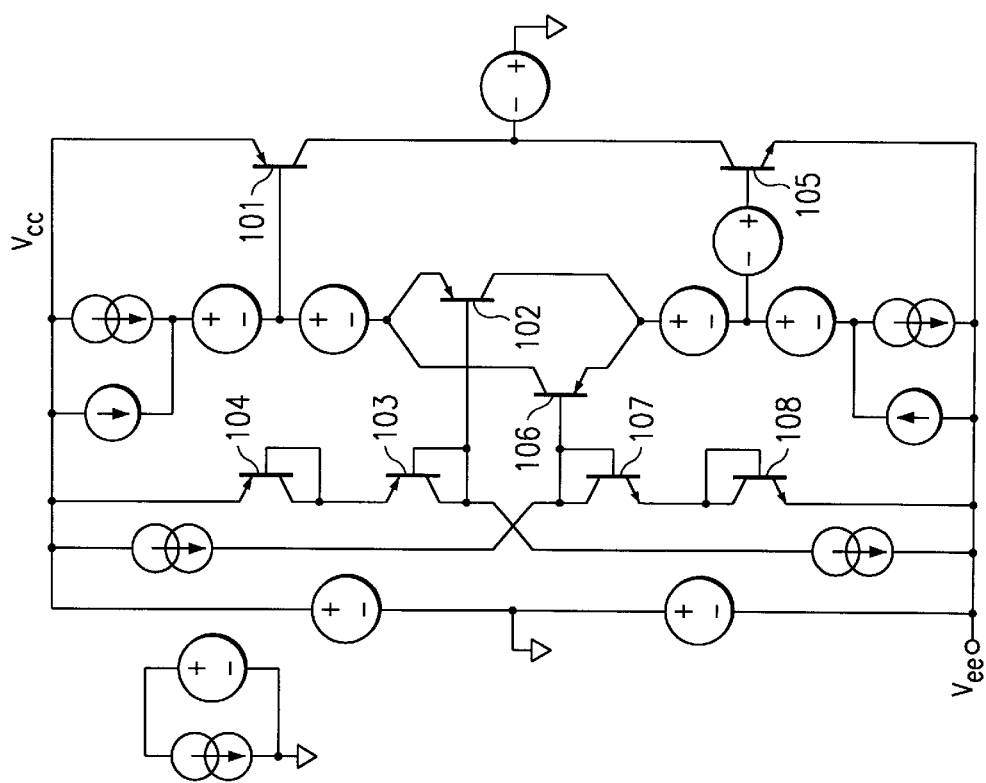
FIG. 22 is a circuit diagram of a conventional operational amplifier illustrating bias setup for the output transistors.

FIG. 22 is a circuit diagram illustrating one technique of bias current generation for a rail to rail output stage in a conventional operational amplifier. The main disadvantage of this configuration is that current gain from the input to the output is only a single β. Also this type of stage will have a large output impedance making compensation more difficult given variation in a load's impedance. In the first and second embodiments of the present invention, translinear principles are used to establish the bias currents in the pre-driver stage.

Referring back to FIGS. 7 and 8, if there is a slight mismatch in the currents through the second transistor 102 and sixth transistor 106 due to an Early voltage mismatch between these two devices, a cascode on the second transistor 102 and the sixth transistor 106 will remedy this effect.

Also referring to FIGS. 7 and 8, assume that feedback introduces a correction term into the circuit to establish equality of collector currents in the first transistor 101 and the fifth transistor 105, then:

$I_{Q101C} = I_{Q105C} = I_{Qpre}$

Thus, from translinear principles:

1. $\dfrac{I_{132}^2}{A_{Q107} * A_{Q108}} = \dfrac{I_{Q106C}}{A_{Q106}} * \dfrac{I_{Qpre}}{A_{Qpre}}$;

2. $\dfrac{I_{132}^2}{A_{Q103} * A_{Q104}} = \dfrac{I_{Q102C}}{A_{Q102}} * \dfrac{I_{Qpre}}{A_{Qpre}}$;

$I_{Q106C} = I_{Q102C} = I_{131}$;  3.

4. $\dfrac{I_{132}^2}{A_{Q107} * A_{Q108}} = \dfrac{A_{Q101}}{I_{QpreC}} * A_{Q106} = I_{Q106C}$;

(derived from equation 1);

5. $\dfrac{I_{132}^2}{A_{Q103} * A_{Q104}} = \dfrac{I_{Q105}}{A_{QpreC}} * A_{Q102} = I_{Q102C}$;

(derived from equation 2);

6. $\dfrac{I_{132}^2}{A_{Q107} * A_{Q108}} * \dfrac{I_{Q105}}{A_{QpreC}} * A_{Q106} +$ $\dfrac{I_{132}^2}{A_{Q103} * A_{Q104}} * \dfrac{A_{Q101}}{I_{QpreC}} * A_{Q102} = I_{131}$;

Thus, $I_{QpreC} = \dfrac{I_{132}^2}{I_{131}} \left( \dfrac{A_{Q105} * A_{Q106}}{A_{Q107} * A_{Q108}} + \dfrac{A_{Q101} * A_{Q102}}{A_{Q103} * A_{Q104}} \right)$.

(derived from equations 3, 4 and 5)

Referring to the operational amplifier output stage 100 shown in FIG. 7, the change in current in the first transistor 101 and the fifth transistor 105 in response to a change in input current is computed as follows: The input current change takes the form of an equal but opposite change in $I_X$ and $I_Y$ given that the difference current between $I_X$ and $I_Y$ (i.e. δI) has to be divided between the bases of the first transistor 101 and the fifth transistor 105. Therefore, $I_o = I_Y - \alpha * \delta I * \beta_p I_Y - (1-\alpha) \delta I - \beta_n$ $\delta I_o = -*\alpha \delta I * \beta_p - (1-\alpha) \delta I * \beta_n$;

$\delta I_o = -\delta I (\alpha * \beta_p + (1-\alpha) - \beta_n)$.

Where α a is greater than zero and less than one, the value of α indicates the proportion of δI delivered into the bases of each of the pre-driver transistors, first transistor 101 and fifth transistor 105.

Where a is approximately zero, $I_X$ has significantly increased and $I_Y$ has significantly decreased by equal and opposite quantities. The base-emitter voltage is large in the second transistor 102 and small in the sixth transistor 106. The second transistor 102 cuts off and all of the difference current between $I_X$ and $I_Y$ (i.e. δ1) flows into the base of the fifth transistor 105. This gives a current gain in the circuit of $\beta_n$.

Where α is approximately equal to one, the opposite of where α is approximately equal to zero occurs. Where $I_X$ significantly decreases, $I_Y$ significantly increases causing all difference current, δI, to flow into base of the first transistor 101, resulting in a current gain of $\beta_p$.

Where α is greater than zero but less than one, the pre-driver sub-stage 122 is in translinear mode. The difference current is split in varying proportion into the first transistor 101 and the fifth transistor 105. Thus, $\delta I_o / \delta I = \alpha * \beta_p + (1-\alpha) * \beta_n$.

Figure 23:
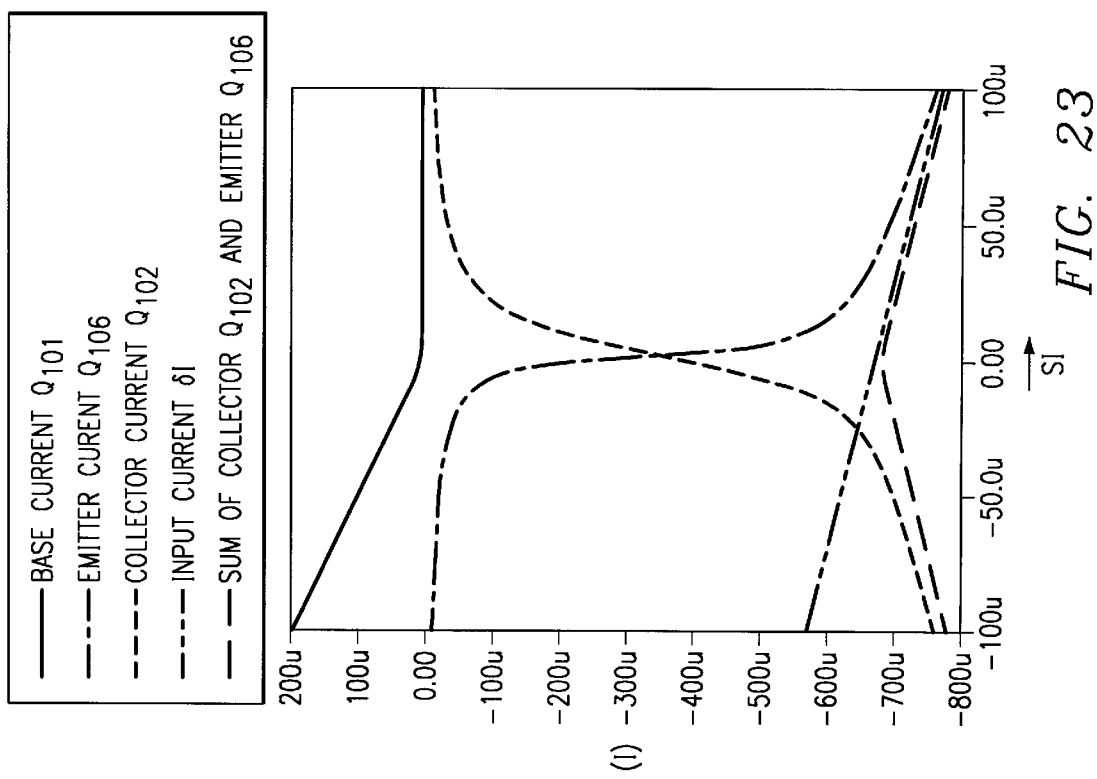
FIG. 23 is a graph illustrating the DC current transfer characteristics of circuit depicted in FIG. 22.

Referring to FIG. 23, the DC response of the pre-driver sub-stage 122 of the present invention is shown.

In connection with the coupling of the pre-driver sub-stage 122 to the final sub-stage 123, the biasing scheme of the pre-drivers and the biasing scheme of the final drivers of the present invention have the advantageous property of not absorbing any signal current. All of the signal current is delivered directly into the bases of the transistors, and none is lost in translinear loops.

The current gain from the input to the output has approximately the form:

$\delta I_o \approx \beta_n * \beta_p * \delta I_{in}$.

Feedback Analysis

When feedback is locally applied by means of some localized feedback circuit, the errors are corrected within a very tight loop which will respond much more quickly than relying on the amplifier overall feedback loop. This localized feedback provides the present invention with high speed capabilities.

Four (4) possibilities are presented: (i) current feedback, transitional β output (ii) current feedback, constant β output (iii) voltage feedback, transitional β output, and (iv) voltage feedback, constant β output.

Figure 24:
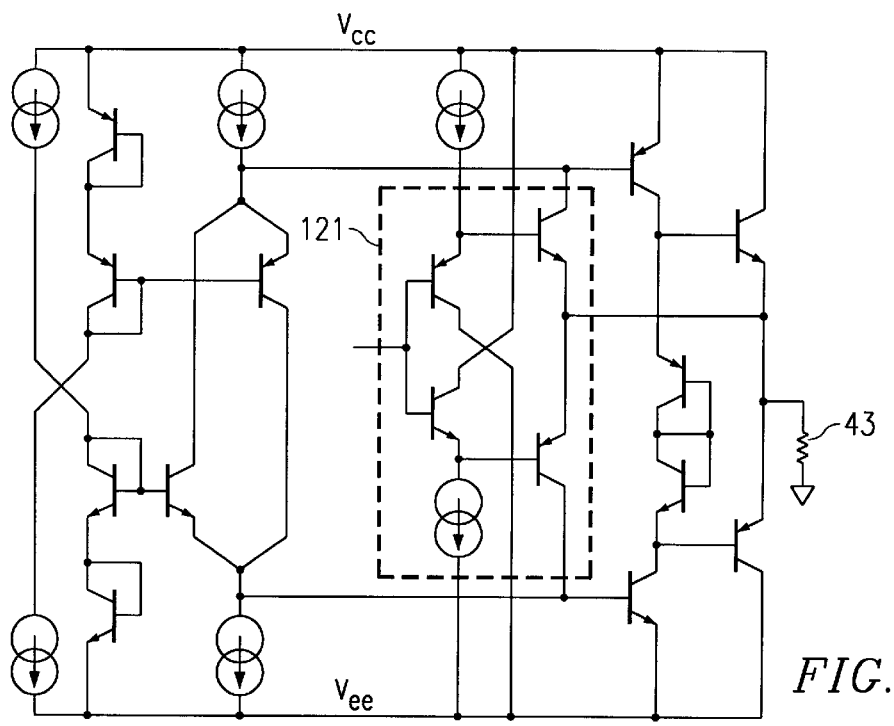
FIG. 24 is a circuit diagram of the first embodiment of the present invention with current feedback circuitry.
Figure 25:
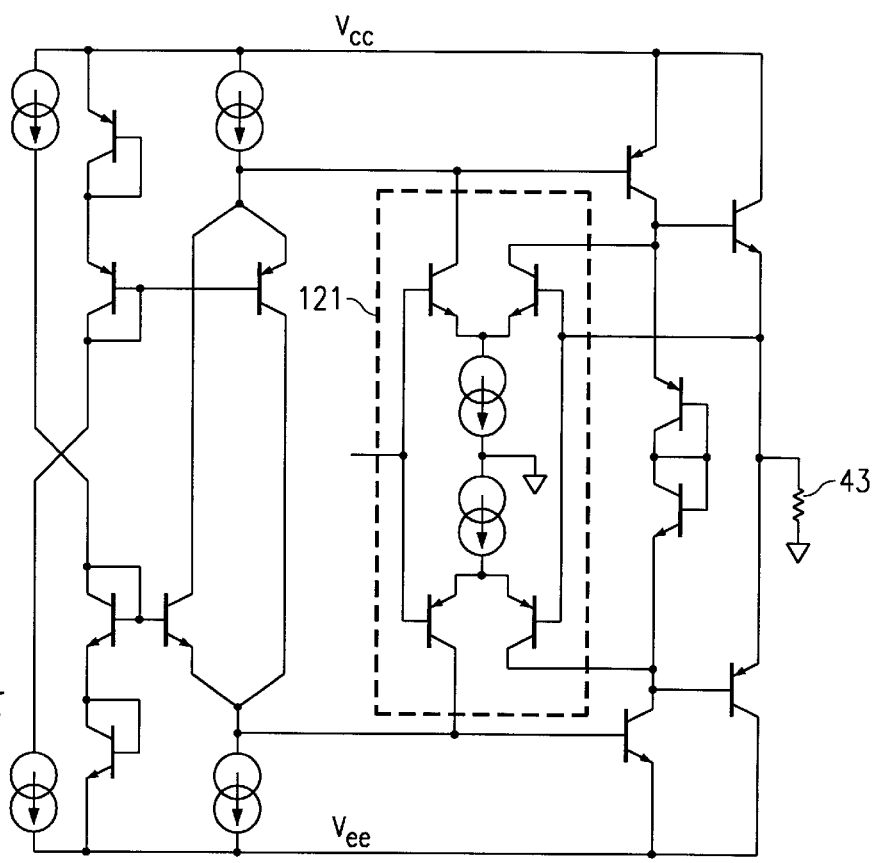
FIG. 25 is a circuit diagram of the first embodiment of the present invention with voltage feedback circuitry.
Figure 26:
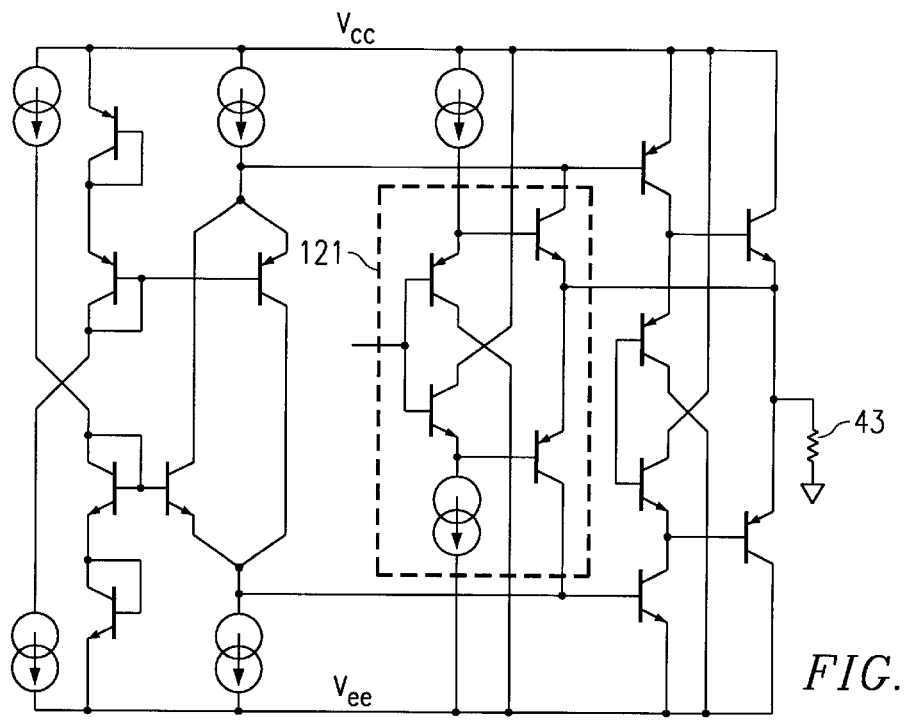
FIG. 26 is a circuit diagram of the second embodiment of the present invention with current feedback.
Figure 27:
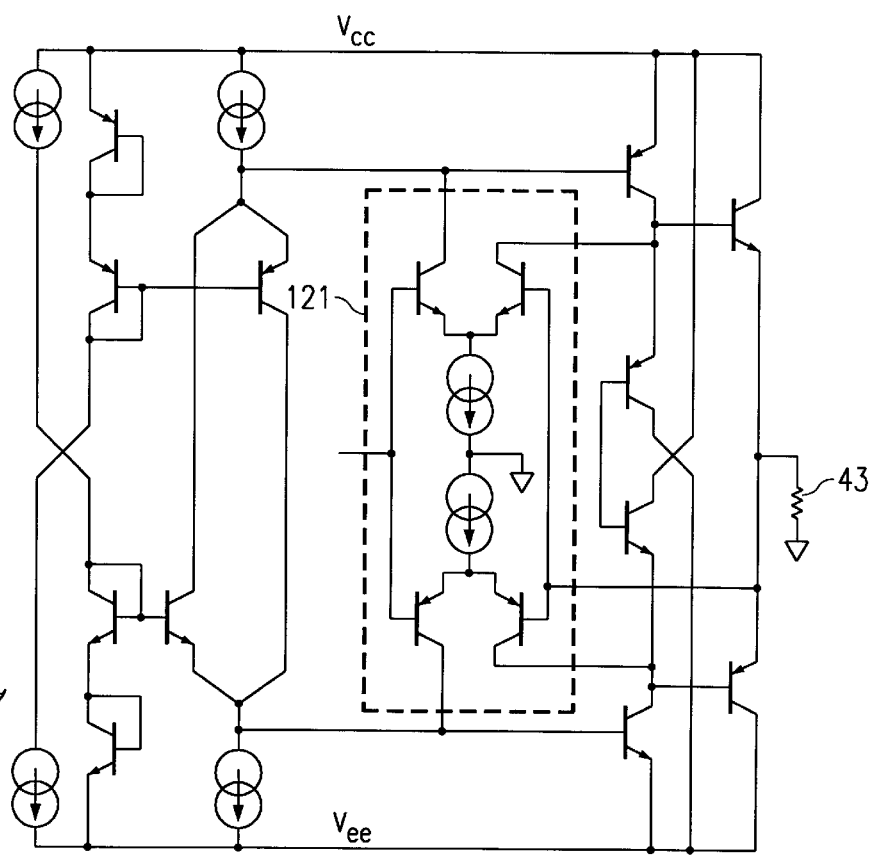
FIG. 27 is a circuit diagram of the second embodiment of the present invention with voltage feedback.
Figure 28A:
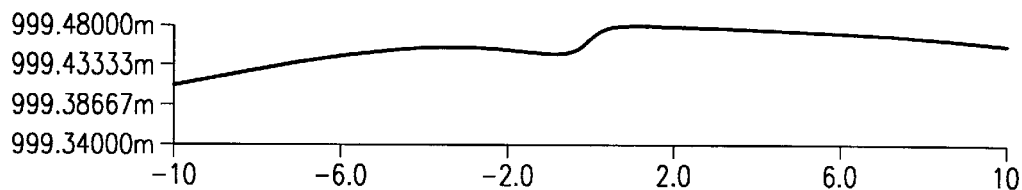
FIGS. 28A, 28B, 28C, 28D, are graph comparing the linearity characteristics between the two conventional operational amplifiers and the first and second embodiments of the present invention. The figure shows the first derivative of the amplifiers' gain.
Figure 28B:
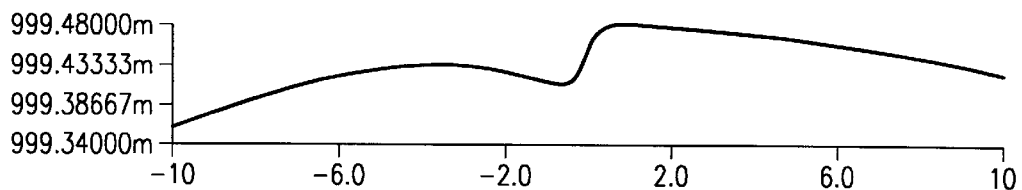
Figure 28C:
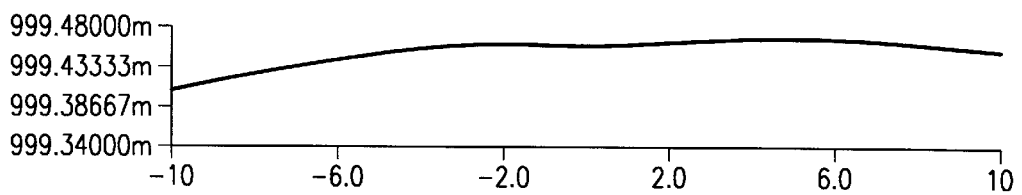
Figure 28D:
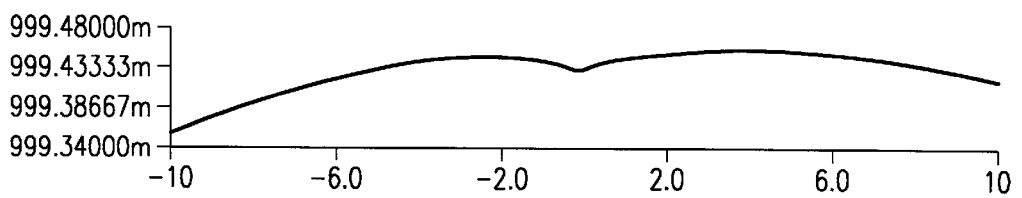

FIG. 24 is a circuit diagram of a first embodiment of the present invention with a current feedback circuitry. FIG. 25 is a circuit diagram of the first embodiment of the present invention with a voltage feedback circuitry.

When the input $g_m$ cell 121 takes the form of a complementary differential pair, the inherent RHPZ appearing when the pre-driver sub-stage is Miller compensated vanishes as the feed forward term contributing to the RHPZ is pulled back out by the differential pair.

FIG. 28 illustrates the output in a closed loop configuration with [greater than unity gain] driving a heavy load over a wide voltage range. In all cases the worst case non-linearity is approximately plus/minus 1 part in 1000. For the current feedback, constant β output, cross-over distortion is virtually eliminated.

Figure 29:
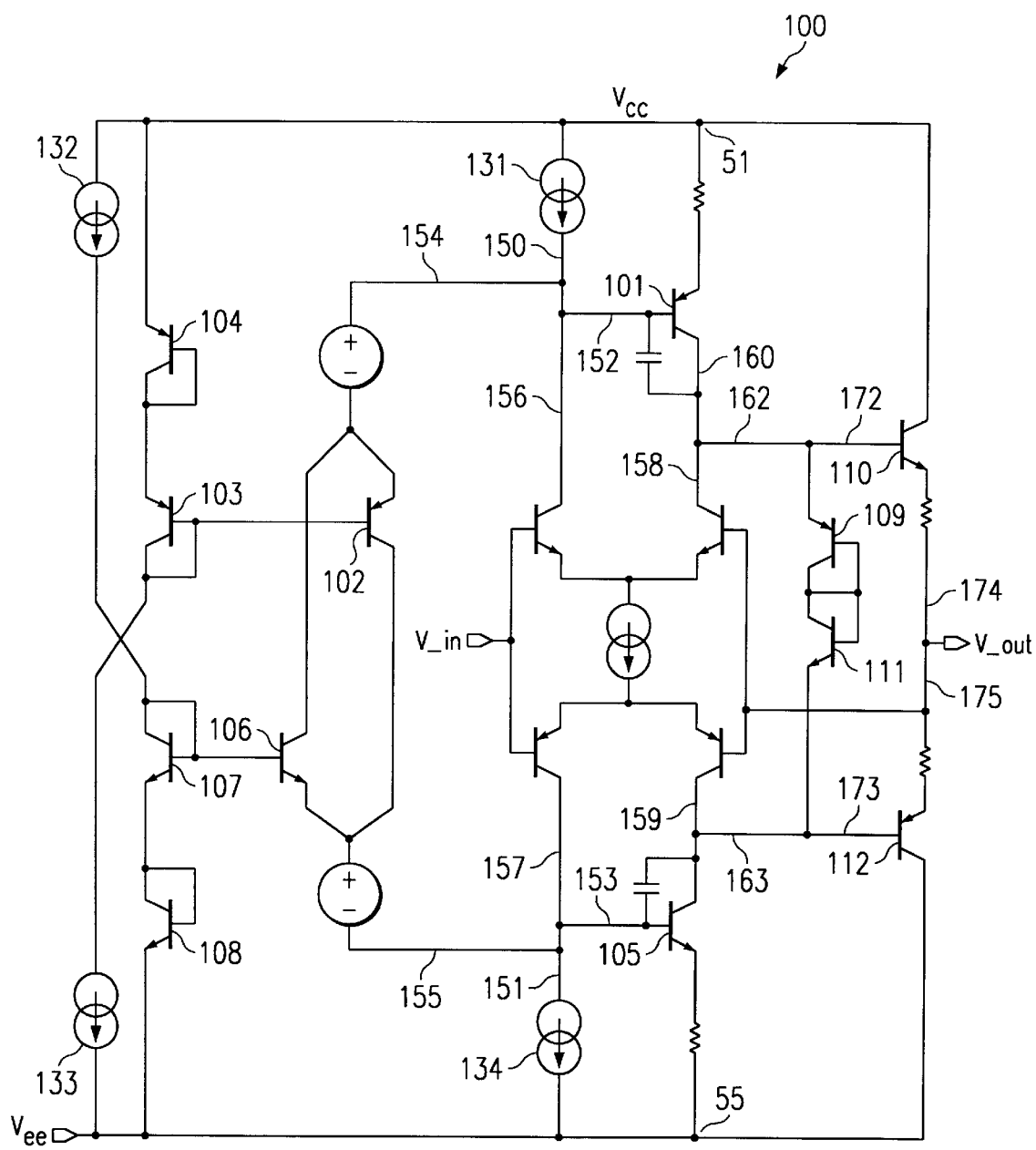
FIG. 29 is a circuit diagram of the first embodiment of the present invention with a compound darlington output stage using type I biasing.

FIG. 29 is a circuit diagram of the first embodiment of the present invention with a compound darlington output stage using type I biasing. A generalized evaluation of this circuit is as follows:

Referring to current through branches 150, 152, 154 156, 158, 160, 172 and 174 in FIG. 29:

Current through branch 150 is $I_{LTP}$; where $I_{LTP}$ refers to the current through current source 131.

Current through branch 152 is: $-\alpha \cdot \delta I$.

Current through branch 154 is:

$\dfrac{I_{LTP}}{2} + \delta I \left( \dfrac{1}{2} - \alpha \right)$.

Current through branch 156 is:

$\dfrac{I_{LTP}}{2} - \dfrac{\delta I}{2}$.

Current through branch 158 is:

$$\frac{I_{LTP}}{2} + \frac{\delta I}{2}.$$

Current through branch 160 is: $I_{biasp} - \beta_{Q101} \cdot \alpha \cdot \delta I$.
Current through branch 162 is approximately equal to:

$$I_{biasp} - \frac{I_{LTP}}{2} - \delta I \cdot \beta_{Q101} \cdot \alpha.$$

Current through 172 is: $-\lambda \cdot \delta I(\beta_{Q101} \cdot \alpha + \beta_{Q105}(1-\alpha))$.
Current through 174 is: $-\lambda \cdot \delta I \cdot (\beta_{Q101} \cdot \alpha + \beta_{Q105}(1-\alpha)) + I_{bias\ out}$.

Referring to current through branches 151, 153, 155, 157, 159, 161, 163, 173 and 175:

Current through branch 151 is $I_{LTP}$; where $I_{LTP}$ refers to the current through current source 134 which is the same as the current through current source 131.

Current through branch 153 is: $(1-\alpha)\delta I$
Current through branch 155 is:

$$\frac{I_{LTP}}{2} + \delta I\left(\frac{1}{2} - \alpha\right).$$

Current through branch 157 is:

$$\frac{I_{LTP}}{2} + \frac{\delta I}{2}.$$

Current through branch 159 is:

$$\frac{I_{LTP}}{2} - \frac{\delta I}{2}.$$

Current through branch 161 is: $I_{bias\ p} + \beta_{Q105} \cdot (1-\alpha)\delta I$.
Current through branch 163 is:

$$I_{biasp} - \frac{I_{LTP}}{2} + \beta_{Q105} \cdot (1-\alpha)\delta I.$$

Current through branch 173 is: $(1-\lambda) \cdot \delta I(\beta_{Q101} \cdot \alpha + \beta_{Q105}(1-\alpha))$.
Current through 175 is: $(1-\lambda) - \delta I(\beta_{Q101} \cdot \alpha + \beta_{Q105}(1-\alpha)) + I_{bias\ out}$.

Therefore:

$$I_{out} = -\lambda \cdot \delta I \cdot \beta_{Q110} \cdot (\beta_{Q101} \cdot \alpha + \beta_{Q105}(1-\alpha)) - 1 - \lambda) \cdot \delta I \cdot \beta_{Q112}(\beta_{Q101} \cdot \alpha + \beta_{Q105}(1-\alpha)).$$

In a first case where $I_{out}$ is large and positive, and load conduction is through transistor 110 and transistor 101, where $\alpha=1$, $\lambda=1$, then:

$$I_{out} = -\delta I \cdot \beta_{Q110} \cdot \beta_{Q101}$$

In a second case where Iout is large and negative, and load conduction is through transistor 112 and transistor 105, where $\alpha=0$, $\lambda=0$, then:

$$I_{out} = -\delta I \cdot \beta_{Q112} \cdot \beta_{Q105}$$

In a third case where $I_{out}$ is very small through the cross-over point, and load conduction is through transistor 110 and transistor 112, where $\alpha \approx 0.5$, $\lambda \approx 0.5$, then:

$$I_{out} = -\delta I\left(\frac{\beta_{Q101} + \beta_{Q105}}{2}\right)\left(\frac{\beta_{110} + \beta_{112}}{2}\right)$$

Thus, for $\beta_{Q112} = \beta_{Q101} = \beta_p$
and $\beta_{Q110} = \beta_{Q105} = \beta_n$ $$I_{out} = -\delta I\left(\frac{\beta_p + \beta_n}{2}\right)^2$$

Figure 30:
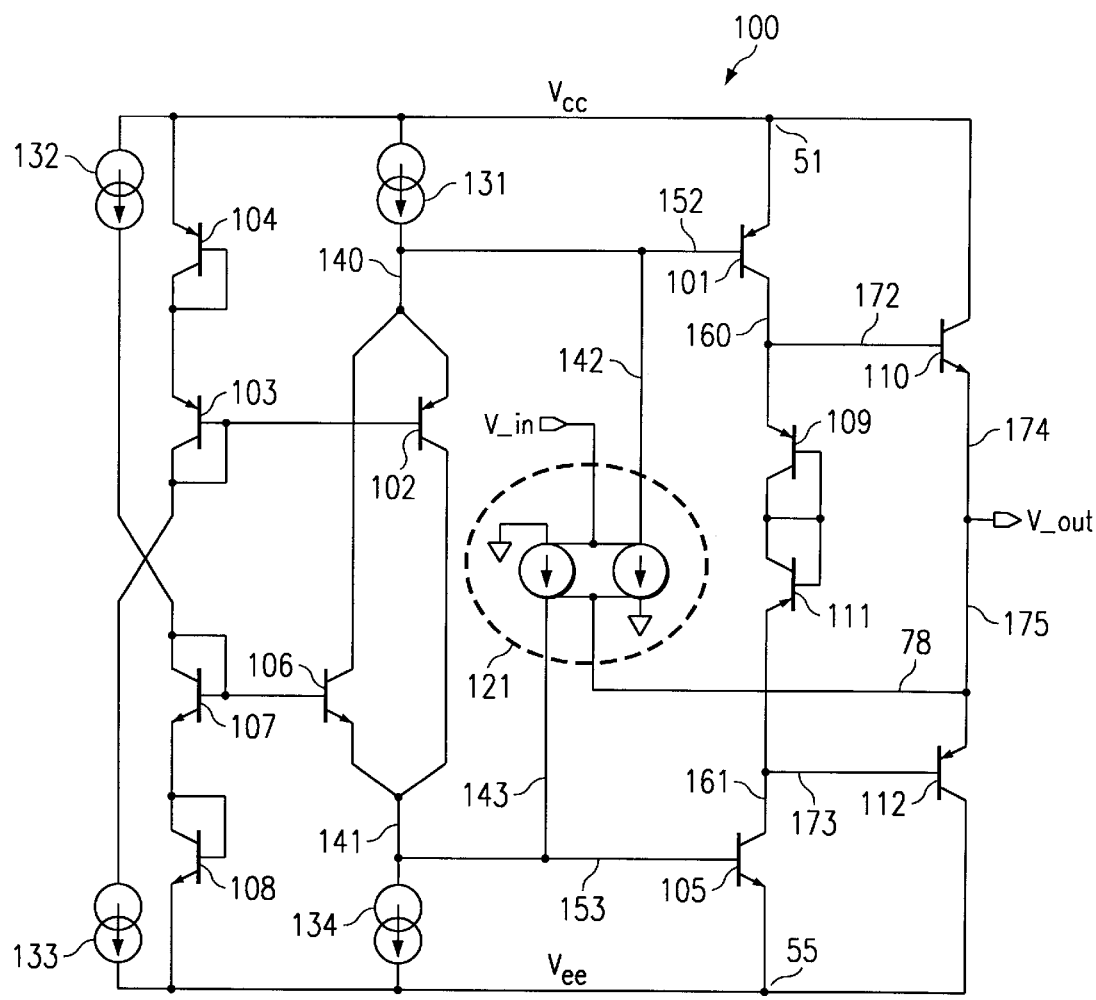
FIG. 30 is a circuit diagram of the first embodiment of the present invention with a compound darlington output stage using type I biasing and a differential pair input $g_m$ cell.

FIG. 30 is a circuit diagram of the first embodiment of the present invention with a compound darlington output stage using type I biasing and a differential pair input $g_m$ cell. A specific evaluation of this circuit is as follows:

Referring to the current through branches 140, 142, 152, 160, 172 and 174 in FIG. 30:

The current through branch 140 is:

$$I_{131} + \delta I(\tfrac{1}{2} - \alpha)$$

The current through branch 142 is:

$$-\frac{\delta I}{2}$$

The current through branches 152, 160, 172 and 174 are the same as that in the equivalent numbered branches in FIG. 29.

Referring to the current through branches 141, 143, 153, 161, 173, and 175 in FIG. 30:

The current through branch 141 is:

$$I_{134} + \delta I(\tfrac{1}{2} - \alpha)$$

The current through branch 143 is:

$$\frac{\delta I}{2}$$

The current through branches 153, 161, 173 and 175 are the same as that in the equivalent numbered branches in FIG. 29.

Therefore:

$$I_{out} = -\lambda \cdot \delta I \cdot \beta_{Q110} \cdot (\beta_{Q101} \cdot \alpha + \beta_{Q105}(1-\alpha)) - (1-\lambda) \cdot \delta I_{Q112}(\beta_{Q101} \cdot \alpha + \beta_{Q105}(1-\alpha)).$$

Referring to FIG. 30, and as noted in FIG. 29, in a first case, where $I_{out}$ is large and positive, and load conduction is through transistor 110 and transistor 101, where $\alpha=1$, $\lambda=1$, then:

$$I_{out} = -\delta I \cdot \beta_{Q110} \cdot \beta_{Q101}$$

In a second case where $I_{out}$ is large and negative, and load conduction is through transistor 112 and transistor 105, where $\alpha=0$, $\lambda=0$, then:

$$I_{out} = -\delta I \cdot \beta_{Q112} \cdot \beta_{Q105}$$

In a third case, where case $I_{out}$ is very small through the cross-over point, and load conduction is through transistor 110 and transistor 112, where $\alpha \approx 0.5$, $\lambda \approx 0.5$, then:

$$I_{out} = -\delta I \left( \frac{\beta_{Q101} + \beta_{Q105}}{2} \right) \left( \frac{\beta_{Q110} + \beta_{Q112}}{2} \right)$$

Thus, for $\beta_{Q112} = \beta_{Q101} = \beta_p$
and $\beta_{Q110} = \beta_{Q105} = \beta_n$ $$I_{out} = -\delta I \left( \frac{\beta_p + \beta_n}{2} \right)^2$$

where $0 < \alpha < 1$;

and $0 < \lambda < 1$ $I_{biasp}$ and $I_{biasout}$ are established using translinear principles.

Compensation

Figure 31:
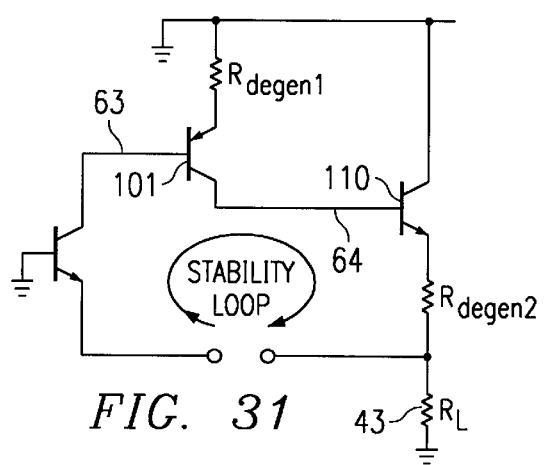
FIG. 31 is a circuit diagram illustrating a current feedback stability loop.

FIGS. 31, 32, 33 and 34 show the various types of compensation techniques that can be used with the present invention. FIG. 31 is a half circuit showing the current feedback case with small signal AC. The circuit is a 2 voltage gain stage amplifier with voltage gain being developed at nodes 63 and 64. The circuit lends itself to classic Miller compensation as shown in FIG. 31.

Referring to FIG. 32, the resistor 81 eliminates the right half plane through the compensation capacitor 85. At the quiescent condition, the value is the reciprocal of the transconductance of the first transistor 101.

FIG. 33 illustrates the voltage feedback case. Referring to the circuit in FIG. 33, there are two (2) loops to be compensated, inner loop 2 and outer loop 1. As can be seen in FIG. 32, similar to the current feedback implementation, the system is a 2 voltage gain stage amplifier with voltage gain at nodes 63 and 64. This circuit can also be Miller compensated. There is no concern with RHPZ because the differential transistor 113 draws the feed forward signal out.

Implementation

It is noted that the voltage feedback implementation can only be used for gain greater than 1. Further, the current feedback implementation can be used for if arbitrary gain. All four implementations can be used as a stand alone amplifier configuration.

FIG. 35 illustrates how gain from the present invention can be preserved where additional lower frequency precision is required.

The advantages of the present invention over conventional operational amplifier output stages is significantly higher linearity for the same supply current or linearity equal to the conventional operational amplifiers.

The current gain obtained in the error correction loop of each of the first and second conventional operational amplifiers is only a single current gain whereas the current gain of the present invention is up to $\beta^2$. Further, the DC nonlinearity of conventional amplifiers is approximately 2 parts per 1000, a factor of 25 worse than the present invention. Reduced current draw is one of the advantages afforded by the design of each of the present invention.

The numerous innovative teachings of the present application are described with particular reference to the disclosed embodiments. However, it should be understood that these embodiments provide only two examples of the many advantageous uses and innovative teachings herein. Various alterations, modifications and substitutions can be made to the disclosed invention without departing in any way from the spirit and scope of the invention, as defined in the claims that follow. For example, although the embodiments have been presented herein with reference to particular transistor types, voltage and current polarities and methods of coupling, the present inventive structures and characteristics are not necessarily limited to particular transistor types, polarities or methods of coupling, as used herein. It should be understood the embodiment used hereinabove can easily be implemented using many diverse transistor types, polarities and methods of coupling so long as the combinations achieve a high beta, high speed operational amplifier output stage with reduced current draw and extended bandwidth.

What is claimed is:

1. An operational amplifier output stage, comprising:

a pre-driver sub-stage and a final sub-stage, the pre-driver sub-stage having a plurality of transistors being biased by a plurality of current sources, the pre-driver sub-stage being adapted to accept a current signal ($\delta I_{in}$) from an input $g_m$ cell;

the pre-driver stage being further adapted to provide biasing to a plurality of transistors in the final sub-stage; and the pre-driver sub-stage being coupled to the final sub-stage so as to provide current gain from input to output of $\delta I_o \approx \beta_n * \beta_p * \delta I_{in}$; and localized feedback circuitry enclosed in the output stage operable to correct signal errors more rapidly than an overall amplifier feedback loop, thereby improving the speed characteristics of the operational amplification output stage.

2. The operational amplifier output stage recited in claim 1, further comprising inherent RHPZ cancellation operable to extend bandwidth.

3. The operational amplifier output stage recited in claim 1, wherein the plurality of transistors in the final sub-stage comprises 4 transistors arranged as a complementary pair of differential transistors enclosed in a localized feedback system.

4. The operational amplifier output stage recited in claim 1 for use in an integrated circuit.

5. The operational amplifier output stage recited in claim 1 for use in a DSL driver.

* * * * *